United States Patent
Hosokawa et al.

(10) Patent No.: US 6,510,535 B1
(45) Date of Patent: *Jan. 21, 2003

(54) METHOD OF DESIGN FOR TESTABILITY FOR INTEGRATED CIRCUITS

(75) Inventors: Toshinori Hosokawa, Osaka (JP); Toshihiro Hiraoka, Osaka (JP)

(73) Assignee: Matsushita Electric Industrial Co., Inc., Kadoma (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/326,231

(22) Filed: Jun. 4, 1999

(30) Foreign Application Priority Data

Jun. 8, 1998 (JP) .......................................... 10-159090
Apr. 14, 1999 (JP) .......................................... 11-106082

(51) Int. Cl.$^7$ .............................................. G01R 31/28
(52) U.S. Cl. .................................................... 714/726
(58) Field of Search ................................ 714/724, 726, 714/727

(56) References Cited

U.S. PATENT DOCUMENTS

| | | | |
|---|---|---|---|
| 5,043,986 A | | 8/1991 | Agrawal et al. ............ 371/25.1 |
| 5,132,974 A | * | 7/1992 | Rosales ........................ 714/731 |
| 5,386,423 A | * | 1/1995 | Koo et al. .................... 714/726 |
| 5,502,646 A | * | 3/1996 | Chakradhar et al. ............ 716/4 |
| 5,502,730 A | * | 3/1996 | Roy et al. .................... 714/726 |
| 5,544,173 A | * | 8/1996 | Meltzer ........................ 714/726 |
| 5,627,841 A | * | 5/1997 | Nakamura ................... 714/731 |
| 5,661,733 A | * | 8/1997 | Schoessow ................... 714/726 |
| 5,828,828 A | * | 10/1998 | Lin et al. ..................... 714/30 |
| 5,862,149 A | * | 1/1999 | Carpenter et al. ........... 714/726 |
| 6,016,564 A | * | 1/2000 | Hosokawa .................... 714/726 |
| 6,036,691 A | * | 3/2000 | Nakao et al. ................. 714/733 |
| 6,067,650 A | * | 5/2000 | Beausang et al. ............ 714/726 |
| 6,189,128 B1 | * | 2/2001 | Asaka ............................. 716/4 |
| 6,237,121 B1 | * | 5/2001 | Yadavalli et al. ............ 714/726 |
| 6,253,343 B1 | * | 6/2001 | Hosokawa et al. .......... 714/726 |

FOREIGN PATENT DOCUMENTS

JP 10-124562 5/1998

OTHER PUBLICATIONS

Hosokawa, T.; Kawaguchi, K.; Ohta, M. and Muraoka, M.; A design for testability method using RTL partitioning; Proceedings of the Fifth Asian Test Symposium, 1996, p.(s): 88–93.*

Tamarapalli, N. and Rajski, J.; Constructive multi–phase test point insertion for scan–based BIST; Proceedings International Test Conference, 1996; p.(s): 649–658.*

(List continued on next page.)

*Primary Examiner*—Albert Decady
*Assistant Examiner*—Joseph D. Torres
(74) *Attorney, Agent, or Firm*—Harness, Dickey & Pierce, PLC

(57) ABSTRACT

A method of design for testability using scan FF identification of this invention eases generation of test sequences as compared with conventional technique. An FF relation graph is generated from an integrated circuit, FFs having self loops are recognized in the FF relation graph, and all FFs are replaced with scan FFs. FFs not having self loops are sorted in accordance with a predetermined evaluation function indicating the degree of relation with difficulty in generating test sequences. For example, a function indicating the degree of relation with a balanced reconvergence structure is used as the evaluation function. In a sort order thus obtained, with regard to each FF not having self loops, it is determined whether or not the integrated circuit has an n-fold line-up structure in assuming the FF is replaced with a non-scan FF, thereby identifying scan FFs.

14 Claims, 45 Drawing Sheets

OTHER PUBLICATIONS

Youssef, M.; Savaria, Y. and Kaminska, B.; Methodology for efficiently inserting and condensing test points (CMOS ICs testing); IEE Proceedings E Computers and Digital Techniques, [See also IEE Proceedings–Computers and DigitalTechniques,], vol.: 140; Is.*

Motohara, A.; Takeoka, S.; Hosokawa, T.; Ohta, M.; Takai, Y.; Matsumoto, M. and Muraoka, M.; Design for testability using register–transfer level partial scan selection; Proceedings of the ASP–DAC '95/CHDL '95/VLSI '95 Design Automation Conference, 1995, I.*

Parikh, P.S. and Abramovici, M.; On combining design for testability techniques; Proceedings International Test Conference, 1995; p.(s): 423–429.*

Dey, S. and Potkonjak, M.; Nonscan design–for–testability techniques using RT–level design information; IEEE Transactions on Computer–Aided Design of Integrated Circuits and Systems, vol.: 16 Issue: 12, Dec. 1997 p.(s): 1488–1506.*

Asaka, T., Bhattacharya, S.; Dey, S. and Yoshida, M.; H–SCAN+: a practical low–overhead RTL design–for–testability technique for industrial designs; Proceedings International Test Conference, 1997; p.(s): 265–274.*

"An Optimization Based Approach to the Partial Scan Design Problem", by Vivek Chickermane and Janak H. Patel, Center for Reliable and High Performance Computing, University of Illinois, International Test Conference, 1990, pp. 377–386.

"A Partial Scan Method Based on Reconvergences," by Toshinobu Ono and Rabindra K. Roy, The Institute of Electronics, Information and Communication Engineers, Technical Report of IEICE, ICD 93–151 (Dec. 1993), pp. 29–36.

"An Exact Algorithm for Selecting Partial Scan Flip–Flops," by Srimat T. Chakradhar, Arun Balakrishnan and Vishwani D. Agrawal; pp. 81–86.

"A Partial Scan Design Method Based on n–Fold Line–up Structures," by Toshinori Hosokawa, Toshihiro Hiraoka, Mitsuyasu Ohta, Michiaka Muraoka, and Shigeo Kuninobu; pp. 306–311.

"An Optical Scan FF Identification Based on n–fold Line–up Structures with Taking into Acount Ballanced Reconvergence Structures," by Toshihiro Hiraoka, Toshinori Hosokawa, Mitsuyasu Ohta from Matsushita Electric Industrial Co., Ltd.; pp. 161–166.

Abramovici, Miron et al.; Digital Systems Test & Testable Design; Chapter 9; "Design for Testability"; Published by Computer Science Press, pp. 343–395; 1990.

* cited by examiner

| FF | Weight |
|----|--------|
| A  | 0      |
| B  | 0      |
| C  | 0      |
| D  | 0      |
| E  | 2      |
| F  | 2      |
| G  | 0      |
| H  | 0      |
| I  | 0      |
| J  | 0      |
| K  | 0      |
| L  | 0      |

| FF | Weight |
|---|---|
| A | 0 |
| B | 4 |
| C | 4 |
| D | 0 |
| E | 4 |
| F | 4 |
| G | 0 |
| H | 0 |
| I | 0 |
| J | 0 |
| K | 0 |
| L | 0 |

| FF | Weight |
|---|---|
| A | 0 |
| B | 4 |
| C | 4 |
| D | 0 |
| E | 0 |
| F | 4 |
| G | 4 |
| H | 0 |
| I | 0 |
| J | 0 |
| K | 0 |
| L | 0 |

| FF | Weight |
|---|---|
| A | 0 |
| B | 12 |
| C | 12 |
| D | 0 |
| E | 12 |
| F | 36 (=12×3) |
| G | 12 |
| H | 24 (=12×2) |
| I | 12 |
| J | 12 |
| K | 12 |
| L | 0 |

| FF | Weight |
|---|---|
| A | 0 |
| B | 8 |
| C | 8 |
| D | 8 |
| E | 0 |
| F | 16 (=8×2) |
| G | 0 |
| H | 0 |
| I | 0 |
| J | 8 |
| K | 8 |
| L | 8 |

| FF | Weight |
|---|---|
| A | 0 |
| B | 12 |
| C | 12 |
| D | 0 |
| E | 12 |
| F | 12 |
| G | 24 (=12×2) |
| H | 24 (=12×2) |
| I | 0 |
| J | 12 |
| K | 12 |
| L | 0 |

| FF | Weight |
|----|--------|
| A  | 0      |
| B  | 0      |
| C  | 0      |
| D  | 0      |
| E  | 0      |
| F  | 0      |
| G  | 4      |
| H  | 4      |
| I  | 0      |
| J  | 4      |
| K  | 4      |
| L  | 0      |

| Reconvergence path | | A | B | C | D | E | F | G | H | I | J | K | L |
|---|---|---|---|---|---|---|---|---|---|---|---|---|---|
| AtoI | 1-stage 2-fold | | | | | 2 | 2 | | | | | | |
| AtoG | 2-stage 2-fold | | 4 | 4 | | 4 | 4 | | | | | | |
| AtoH | 2-stage 2-fold | | 4 | 4 | | | 4 | 4 | | | | | |
| AtoPO | 3-stage 4-fold | | 12 | 12 | | 12 | 36 | 12 | 24 | 12 | 12 | 12 | |
| AtoJ | 4-stage 2-fold | | 8 | 8 | 8 | | 16 | | | | 8 | 8 | 8 |
| AtoPO | 3-stage 4-fold | | 12 | 12 | | 12 | 12 | 24 | 24 | | 12 | 12 | |
| FtoPO | 2-stage 2-fold | | | | | | | 4 | 4 | | 4 | 4 | |
| Total | | 0 | 40 | 40 | 8 | 30 | 74 | 44 | 52 | 12 | 36 | 36 | 8 |

↓ Sort

A D L I E J K B C G H F

Small ——————————————→ Large

|   | Input | Output | Total |
|---|---|---|---|
| PI | — | 3 | (3) |
| A | 1 | 3 | 4 |
| B | 1 | 2 | 3 |
| C | 1 | 1 | 2 |
| D | 1 | 1 | 2 |
| E | 1 | 1 | 2 |
| F | 2 | 1 | 3 |
| G | 1 | 1 | 2 |
| H | 1 | 1 | 2 |
| I | 1 | 1 | 2 |
| J | 1 | 1 | 2 |
| K | 3 | 1 | 4 |
| PO | 1 | — | (1) |

↓ Sort

Small   C D E G H I J B F A K   → Large

|   | Maximum sequential input distance (X) | Maximum sequential output distance (Y) | $\frac{X+Y}{|X-Y|}$ |
|---|---|---|---|
| A | 0 | 7 | 1 |
| B | 1 | 6 | 1.4 |
| C | 2 | 5 | 2.33 |
| D | 3 | 4 | 7 |
| E | 4 | 3 | 7 |
| F | 5 | 2 | 2.33 |
| G | 6 | 1 | 1.4 |
| H | 7 | 0 | 1 |
| I | 0 | 1 | 1 |
| J | 1 | 0 | 1 |

↓ Sort

Small  A  H  I  J  B  G  C  F  D  E  → Large

Fig. 33

| balanced reconvergence structure | FF |
|---|---|
| (A, I) (1, 2) | E, F |
| (A, G) (2, 2) | B, E, C, F |
| (A, H) (2, 2) | B, F, C, G |
| (A, P01) (3, 4) | H, I, K, C, G, F×3, J, B, E |
| (A, P01) (4, 3) | H, K, G, J, C, F×2, B, E |
| (F, P01) (2, 2) | H, K, G, J |

Fig. 34

| FF | Weight |
|---|---|
| B | 4 |
| C | 4 |
| E | 3 |
| F | 7 |
| G | 4 |
| H | 3 |
| I | 1 |
| J | 3 |
| K | 3 |

⇒ Scan FF

Fig. 36

| balanced reconvergence structure | FF |
|---|---|
| (PPIF, PO1) (2, 2) | H, K, G, J |

Fig. 37

| FF | Weight |
|---|---|
| H | 1 |
| K | 1 |
| G | 1 |
| J | 1 |

⇒ Scan FF

Fig. 40

| FF | Weight |
|---|---|
| B | 2 |
| C | 2 |
| E | 2 |
| F | 5 |
| G | 2 |
| H | 2 |
| I | 1 |
| J | 2 |
| K | 2 |

⇒ Scan FF

Fig. 43

| balanced reconvergence structure | Number of FF | FF |
|---|---|---|
| (PI2, E) (2, 2) | 4 | A, B, C, D |
| (PI2, PO) (5, 9) | 19 | I, M, Q, H, J, K, L, P, G×2, E, F, O, C×2, D×3, N, R, S, A, B×4 |
| (B, O) (1, 4) | 4 | D, N, R, S |
| (C, I) (2, 3) | 5 | H, J, K, G×2, E |
| (D, PO) (3, 3) | 9 | I, M, Q, K, L, P, E, F, O |
| (G, I) (1, 2) | 2 | H, J |

Fig. 44

| FF | Weight |
|---|---|
| A | 1 |
| B | 4 |
| C | 2 |
| D | 3 |
| E | 2 |
| F | 2 |
| G | 2 |
| H | 1 |
| I | 2 |
| J | 1 |
| K | 2 |
| L | 2 |
| M | 2 |
| N | 1 |
| O | 2 |
| P | 2 |
| Q | 2 |
| R | 1 |
| S | 1 |

⇒ Scan FF

Fig. 46

| balanced reconvergence structure | Number of FF | FF |
|---|---|---|
| (PPIB, O) (1, 4) | 4 | D, N, R, S |
| (C, I) (2, 3) | 5 | H, J, K, G×2, E |
| (D, PO) (3, 3) | 9 | I, M, Q, K, L, P, E, F, O |
| (G, I) (1, 2) | 2 | H, J |

Fig. 47

| FF | Weight |
|---|---|
| I | 1 |
| M | 1 |
| Q | 1 |
| K | 1 |
| L | 1 |
| P | 1 |
| E | 1 |
| F | 1 |
| O | 1 |

⇒ Scan FF

Fig. 49

| balanced reconvergence structure | Number of FF | FF |
|---|---|---|
| (PPIB, O) (1, 4) | 4 | D, N, R, S |
| (D, PO) (3, 2) | 6 | F, O, L, P, M, Q |
| (G, I) (1, 2) | 2 | H, J |

METHOD OF DESIGN FOR TESTABILITY FOR INTEGRATED CIRCUITS

BACKGROUND OF THE INVENTION

The present invention relates to a method of design for testability for integrated circuits.

The scan design method is one of the conventional typical methods of design for testability. In the scan design method, a flip-flop (FF) included in a logically designed integrated circuit is replaced with a scan FF that can be externally directly controlled (scanned in) and observed (scanned out), and the scan FF is dealt with as a primary input/output. Thus, test sequences can be easily generated ("Digital Systems Testing and Testable DESIGN, Chapter 9: Design for Testability", 1990, published by Computer Science Press).

The scan design is classified into two types: full scan design method in which all the FFs in a circuit are replaced with scan FFs; and partial scan design method in which part of FFs in a circuit are replaced with scan FFs. The full scan design method has disadvantages of a large area, low speed and high power consumption derived from addition of a test circuit, and these disadvantages can be reduced by the partial scan design method. A scan FF identification method usable in the partial scan design is described in detail in "An Exact Algorithm for Selecting Partial Scan Flipflop" (1994, DAC (Design Automation Conference), pp. 81–86) and its reference paper.

Also, a technique to identify scan FFs so that an integrated circuit can have an n-fold line-up structure has already been proposed ("A partial scan design method based on n-fold line up structures", 1997, 6th Asian Test Symposium, pp. 306–311). An "n-fold line-up structure" is a structure for easing generation of test sequences for faults (see, for example, Japanese Laid-Open Patent Publication No. 10-124562). When scan FFs are identified so that an integrated circuit can have an n-fold line-up structure, high fault efficiency that cannot be achieved by the conventional partial scan design can be achieved.

FIG. 51 is a flowchart for showing procedures in identifying scan FFs so that an integrated circuit can have an n-fold line-up structure. First, all FFs are replaced with scan FFs (SJ3), thereby forming a so-called full scan circuit. It is then determined whether or not the circuit has an n-fold line-up structure when a given scan FF is replaced with a non-scan FF. When the circuit has an n-fold line-up structure, the FF is identified as a non-scan FF, and when not, the FF is identified as a scan FF (SJ5 through SJ7). Such procedures are executed on all the FFs not having self loops (SJ4).

However, in the conventional algorithm, scan FFs are identified so that an integrated circuit can have an n-fold line-up structure, but the scan ratio of the integrated circuit resulting from the identification is not considered. Therefore, as a result of the method of design for testability, the scan ratio can be unnecessarily increased. When the scan ratio is increased, the area of a test circuit to be added to the integrated circuit is increased, resulting in reducing the advantages of the partial scan method.

Also, in accordance with examination made by the present inventor, it is found that the scan ratio of an integrated circuit and difficulty in generating test sequences can be largely varied depending upon the order of FFs subjected to the scan FF identification in the conventional algorithm.

SUMMARY OF THE INVENTION

An object of the invention is achieving higher fault efficiency in a method of design for testability using scan FF or register identification.

Specifically, the method of design for testability of this invention for modifying design of an integrated circuit designed at gate level or register transfer level, in order to attain testability after manufacture, comprises a full scan process for temporarily determining about all flip-flops (FFs) or registers in the integrated circuit to replace with scan FFs or registers; a sorting process for sorting the FFs or registers in accordance with a predetermined evaluation function indicating a degree of relation with difficulty in generating test sequences; and a non-scan selecting process for examining for each of the FFs or registers temporarily determined to replace with scan FFs or registers in the full scan process, in a sort order obtained in the sorting process, whether or not the integrated circuit has an n-fold line-up structure in assuming the FF or register to replace with a non-scan FF or register, and temporarily identifying the FF or register as a non-scan FF or register when the integrated circuit has an n-fold line-up structure by said assumption, wherein an FF or register temporarily identified as a scan FF or register as a result of executing the non-scan selecting process is defined as a scan FF or register.

In this method, respective FFs or registers are subjected to the scan FF or register identification in a sort order according to the predetermined evaluation function indicating the degree of relation with difficulty in generating test sequences. Accordingly, a circuit for which test sequences can be easily generated is obtained, resulting in improving the fault efficiency as compared with that achieved by the conventional technique.

The sorting process preferably comprises the steps of recognizing a balanced reconvergence structure included in the integrated circuit; and sorting the FFs or registers with using a function indicating a degree of relation with the recognized balanced reconvergence structure as the predetermined evaluation function. Alternatively, the sorting process preferably comprises the step of sorting the FFs or registers with using a number of inputs/outputs of each FF or register in an FF relation graph or a register relation graph representing the integrated circuit as the predetermined evaluation function. Alternatively, the sorting process preferably comprises the step of sorting the FFs or registers with using a result of a predetermined calculation using a maximum sequential input distance and a maximum sequential output distance as the predetermined evaluation function.

Alternatively, the method of design for testability of this invention for modifying design of an integrated circuit designed at gate level or register transfer level, in order to attain testability after manufacture, comprises a step of identifying a scan FF or register in the integrated circuit so that the integrated circuit does not have a balanced reconvergence structure satisfying a predetermined condition.

The predetermined condition is preferably having a depth of a predetermined number or more, including a predetermined number or more paths, or including a predetermined number or more FFs.

Alternatively, the method of design for testability of this invention for modifying design of an integrated circuit designed at gate level or register transfer level, in order to attain testability after manufacture, comprises a step of identifying a scan flip-flop (FF) or register in the integrated circuit so that the integrated circuit has an n-fold line-up structure, wherein the identification step comprises the steps of sorting FFs or registers in the integrated circuit in accordance with a predetermined evaluation function indicating a degree of relation with difficulty in generating test sequences; and determining for each of the FFs or registers in the integrated circuit whether or not to replace with a scan FF or register in a sort order obtained in the sorting process.

Alternatively, the method of design for testability of this invention for modifying design of an integrated circuit designed at gate level or register transfer level, in order to attain testability after manufacture, comprises a step of identifying a scan flip-flop (FF) or register in the integrated circuit so that the integrated circuit has an n-fold line-up structure, wherein the identification step comprises the steps of searching a single-output FF or a single-output register in the integrated circuit; and identifying the searched single-output FF or single-output register as a non-scan FF or register.

Alternatively, the method of design for testability of this invention for modifying design of an integrated circuit designed at gate level or register transfer level, in order to attain testability after manufacture, comprises a step of identifying a scan flip-flop (FF) or register in the integrated circuit so that the integrated circuit has an n-fold line-up structure, wherein the identification step comprises the steps of searching a single-input/output FF or a single-input/output register in the integrated circuit; and identifying the searched single-input/output FF or single-input/output register as a non-scan FF or register.

BRIEF DESCRIPTION OF THE DRAWINGS

FIG. 33 is a diagram for showing balanced reconvergence structures recognized in FIG. 32;

FIG. 34 is a diagram for showing weights to be added to respective FFs determined based on the balanced reconvergence structures of FIG. 33 in Embodiment 5;

FIG. 36 is a diagram for showing a balanced reconvergence structure recognized in FIG. 35;

FIG. 37 is a diagram for showing weights to be added to respective FFs determined based on the balanced reconvergence structure of FIG. 36 in Embodiment 5;

FIG. 40 is a diagram for showing weights to be added to respective FFs determined based on the balanced reconvergence structures of FIG. 33 in Embodiment 6;

FIG. 43 is a diagram for showing balanced reconvergence structures recognized in FIG. 42;

FIG. 44 is a diagram for showing weights to be added to respective FFs determined based on the balanced reconvergence structures of FIG. 43 in Embodiment 7;

FIG. 46 is a diagram for showing balanced reconvergence structures recognized in FIG. 45;

FIG. 47 is a diagram for showing weights to be added to respective FFs determined based on the balanced reconvergence structures of FIG. 46 in Embodiment 7;

FIG. 49 is a diagram for showing balanced reconvergence structures recognized in FIG. 48;

DETAILED DESCRIPTION OF THE INVENTION

EMBODIMENT 1

Embodiment 1 of the invention is characterized by using a circuit structure designated as a "balanced reconvergence structure", which is presumed to make generation of test sequences difficult, so as to sort the order of FFs to be subjected to scan FF identification.

Figure 1:
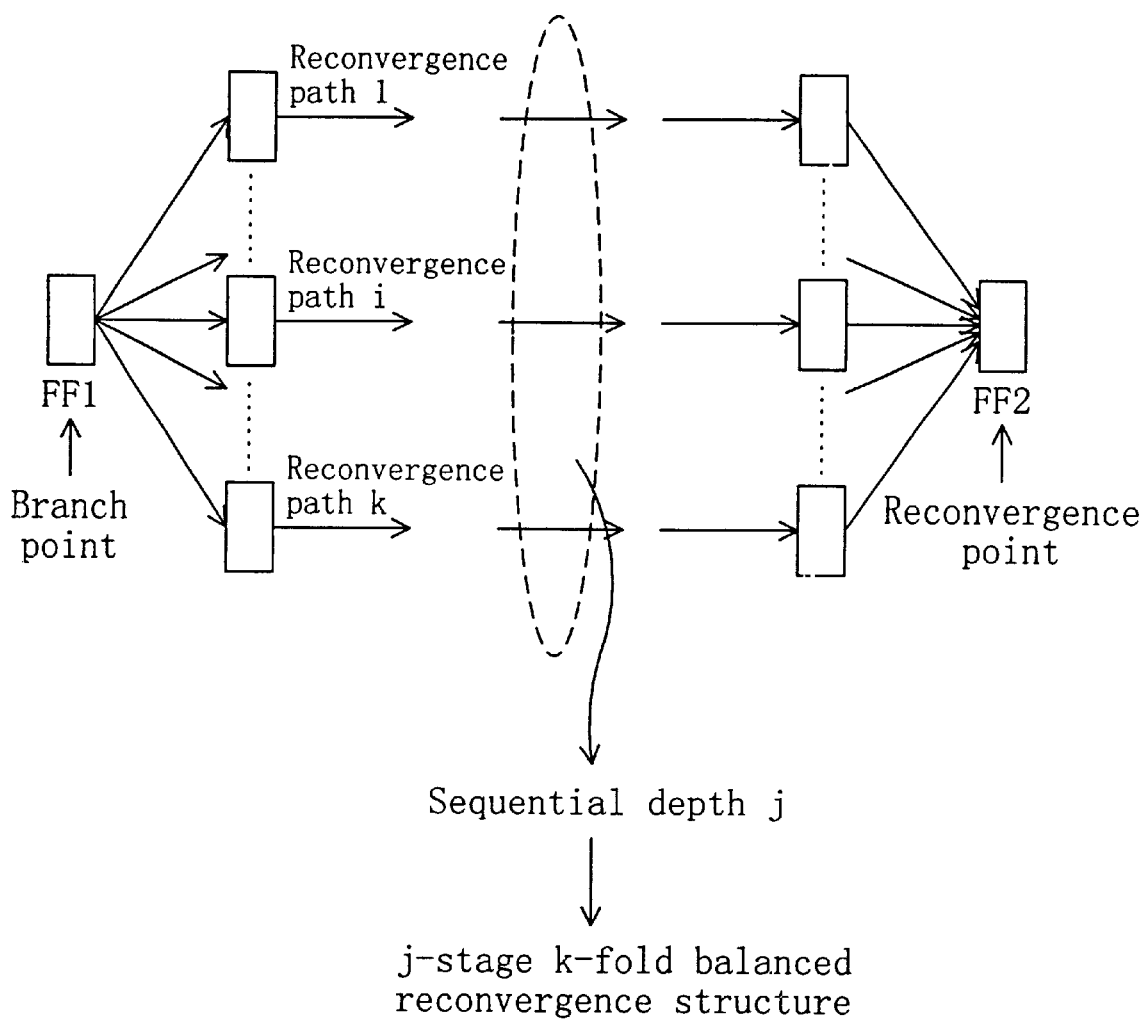
FIG. 1 is a conceptual diagram of a balanced reconvergence structure.

FIG. 1 is a conceptual diagram of a balanced reconvergence structure. In a reconvergence structure in an FF relation graph of a circuit, an FF or a (pseudo) primary input corresponding to a starting point of the reconvergence structure is designated as a branch point of the reconvergence structure (hereinafter simply referred to as the branch point), and an FF or a (pseudo) primary output corresponding to an end point of the reconvergence structure is designated as a reconvergence point of the reconvergence structure. An "FF relation graph" is a directed graph representing connection of primary inputs/outputs and FFs in a circuit excluding combination logic.

In reconvergence structures in an FF relation graph, a structure in which there are two or more reconvergence paths having the same sequential depth (of 1 or more) among all the paths between a branch point and a reconvergence point is defined as a "balanced reconvergence structure". In particular, when the sequential depth is j and the number of paths is k, the structure is designated as a "j-stage k-fold balanced reconvergence structure" having a depth j and multiplicity k. Also, a j-stage k-fold balanced reconvergence structure formed between a branch point BR to a reconvergence point RC is herein indicated as (BR, RC) (j, k).

Now, difficulty in generating test sequences for a circuit including a balanced reconvergence structure will be described with reference to FIG. 2.

Figure 2:
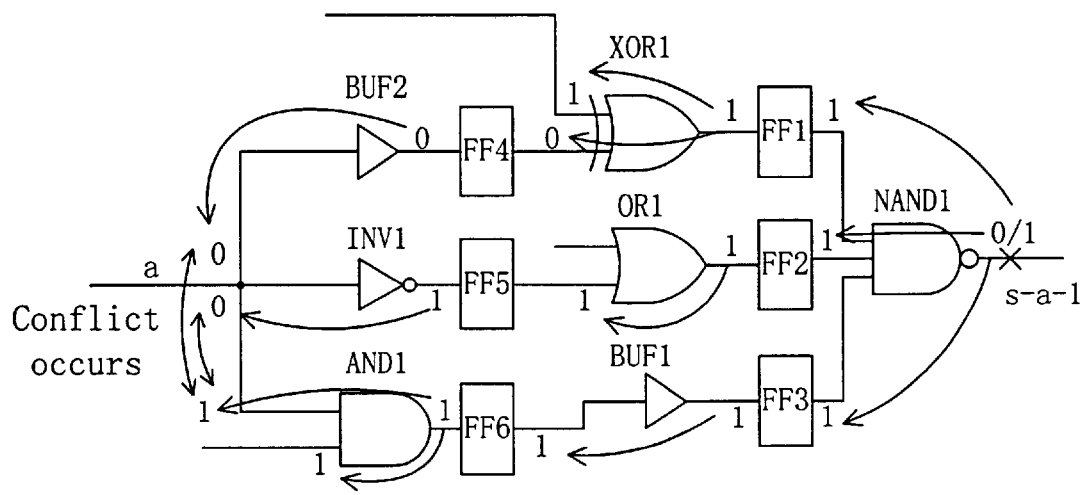
FIG. 2 is a diagram of a circuit including a two-stage three-fold balanced reconvergence structure for illustrating difficulty in test sequence generation for a circuit including a balanced reconvergence structure.

FIG. 2 is a diagram of a circuit including a 2-stage 3-fold balanced reconvergence structure. In FIG. 2, it is herein assumed that test sequences are to be generated with respect to stuck at "1" fault (s-a-1) of an output signal line of a NAND 1 gate. As is shown in FIG. 2, it is necessary to set a normal value of the output signal line of the NAND 1 at "0" in order to excite the fault, and for this purpose, "1" is assigned to FF 1, FF 2 and FF 3.

In order to justify "1" assigned to FF 1, "1" is assigned to XOR 1. In order to justify "1" assigned to XOR 1, selection is conducted so that "1" and "0" can be respectively assigned to the two inputs of XOR 1. Herein, "0" is assumed to be assigned to the input connected with FF 4 (selective assignment A). Similarly, in order to justify "1" assigned to FF 2, "1" is assigned to OR 1. In order to justify "1" assigned to OR 1, selection is conducted so that "1" can be assigned to one of the inputs of OR 1. Herein, "1" is assumed to be assigned to the input connected with FF 5 (selective assignment B). Furthermore, in order to justify "1" assigned to FF 3, "1" is assigned to FF 6.

When "0" of FF 4, "1" of FF 5 and "1" of FF 6 are all justified, conflict is caused in a signal line a. In this case, a backtracking process is required.

In this exemplified case, selection is required for justification of the values of XOR 1 and OR 1, and the aforementioned selective assignment A and B are carried out for the selection, resulting in causing the conflict in the signal line a. In this manner, when a circuit includes a balanced reconvergence structure, there is large possibility of conflict caused in generating test sequences.

Figure 3:
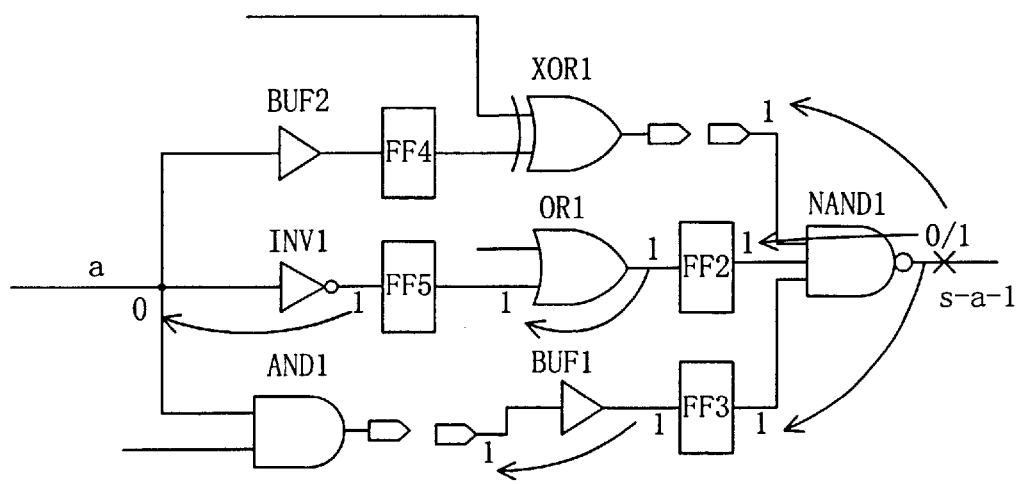
FIG. 3 is a diagram resulting from replacing an FF 1 and an FF 6 with scan FFs in the circuit of FIG. 2.

Therefore, when the balanced reconvergence structure in the circuit is deleted by replacing FF 1 and FF 6 with scan FFs as is shown in FIG. 3, test sequences can be generated without causing conflict in the signal line a.

In this manner, a balanced reconvergence structure is a factor in lowering testability of an integrated circuit. Accordingly, in this embodiment, a function indicating the degree of relation with a "balanced reconvergence structure" is used for sorting the order of FFs subjected to scan FF identification. As a result, the fault efficiency resulting from the scan design can be further improved.

Figure 4:
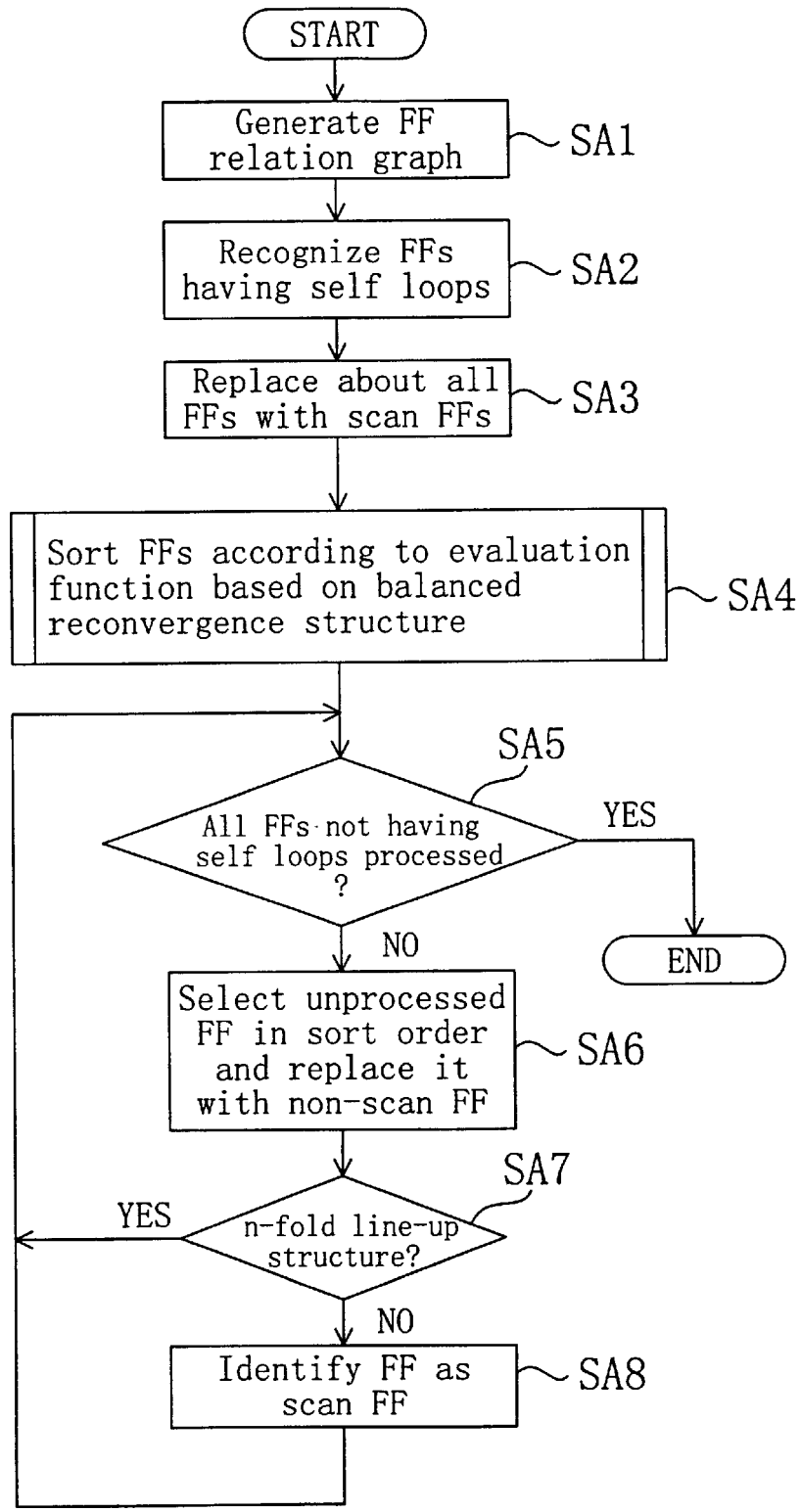
FIG. 4 is a flowchart of a method of design for testability according to Embodiment 1 of the invention.
Figure 5:
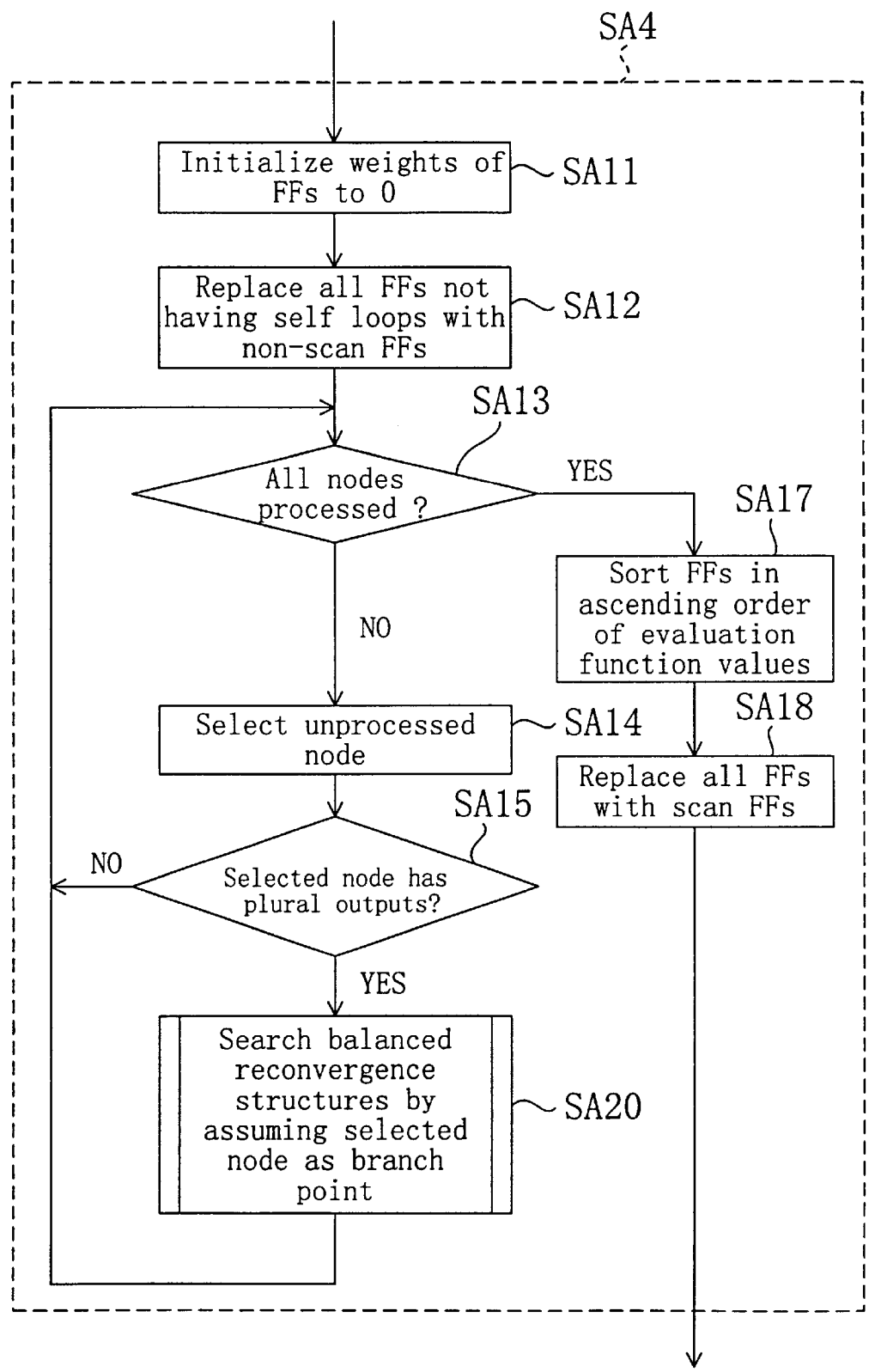
FIG. 5 is a flowchart for showing detailed procedures in a sorting process SA4 of FIG. 4.
Figure 6:
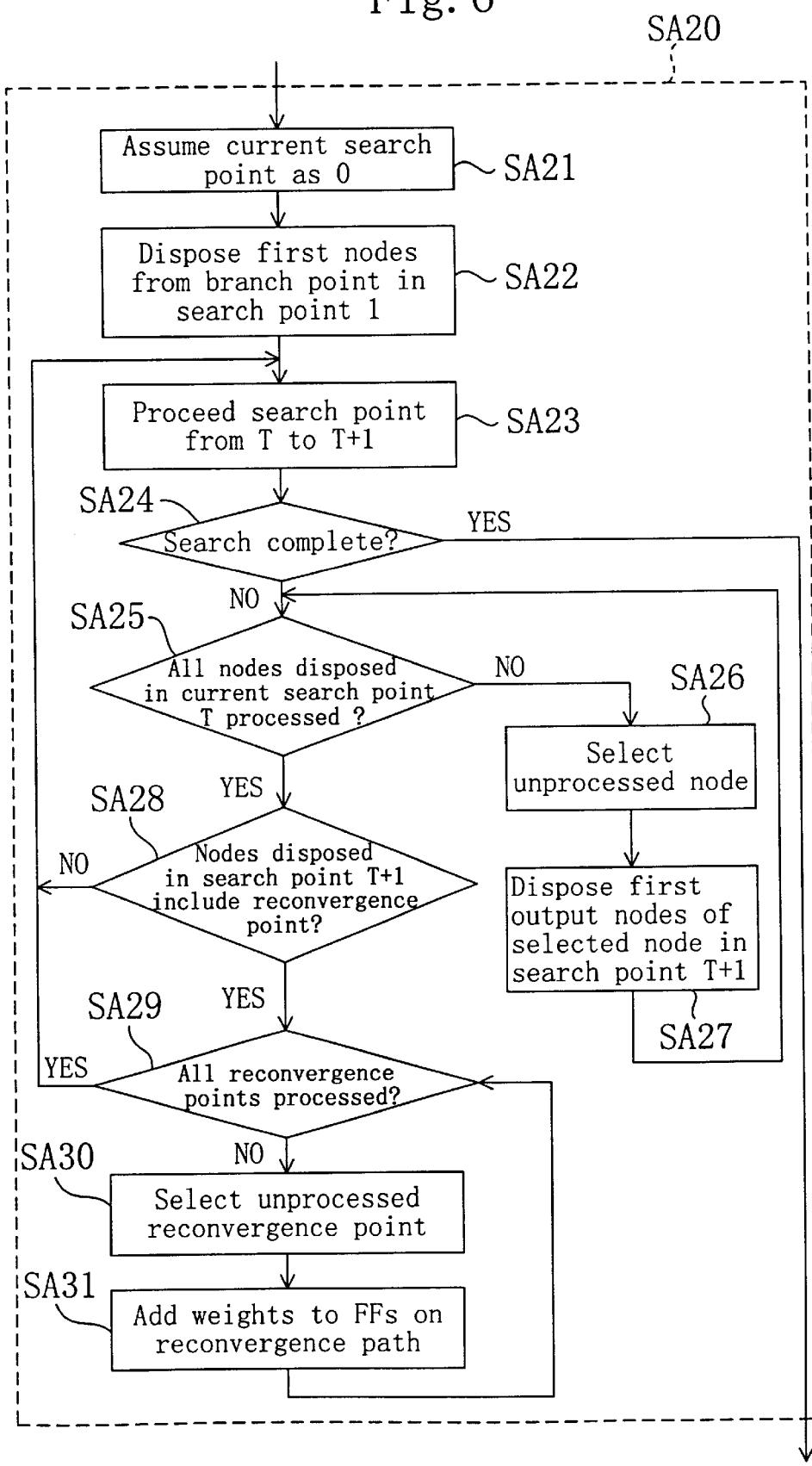
FIG. 6 is a flowchart for showing detailed procedures in step SA20 of FIG. 5.

FIGS. 4 through 6 are flowcharts for showing procedures in a method of design for testability according to Embodiment 1 of the invention.

First in FIG. 4, with respect to an integrated circuit, that is, a target of design for testability, an FF relation graph is generated in step SA1. In step SA2, FFs having self loops are recognized in the FF relation graph generated in step SA1. Then, in step SA3, it is temporarily determined that all FFs in the integrated circuit are replaced with scan FFs.

In step SA4, FFs not having self loops are sorted in accordance with a predetermined evaluation function indicating the degree of relation with difficulty in generating test sequences. In this embodiment, a balanced reconvergence structure included in the integrated circuit is recognized, and the FFs are sorted by using a function indicating the degree of relation with the recognized balanced reconvergence structure as the predetermined evaluation function. The evaluation function of each FF used for sorting is weighted on the basis of the depth or the multiplicity of the balanced reconvergence structure including the FF or the number of reconvergence paths including the FF.

In step SA5, with respect to all the FFs not having self loops, it is checked whether or not procedures of steps SA6 through SA8 have been executed.

In step SA6, one FF not processed is selected in the sort order obtained in step SA4, and it is assumed that the selected FF is replaced with a non-scan FF. In step SA7, it is checked whether or not the integrated circuit has an n-fold line-up structure. When the circuit has an n-fold line-up structure, the selected FF is temporarily determined to replace with a non-scan FF, and the procedure returns to step SA5. When not, the procedure proceeds to step SA8, so that the selected FF is temporarily determined to replace with a scan FF.

The FFs temporarily determined to replaced with scan FFs as a result of executing the non-scan selecting process in steps SA5 through SA8 are identified as scan FFs.

FIG. 5 is a flowchart for showing detailed procedures in step SA4 of FIG. 4.

First, the weights for sorting of all the FFs are initialized to 0 (SA11), and all FFs not having self loops are replaced with non-scan FFs (SA12). In step SA13, it is checked whether or not procedures in steps SA14 through SA20 have been executed on all the FFs replaced with non-scan FFs and all primary inputs (PIs) and pseudo primary inputs (PPIs). When it is determined that the procedures have been executed on all of them, the procedure proceeds to step SA17, and when not, the procedure proceeds to step SA14.

In step SA14, one FF or (pseudo) primary input not processed is selected as a node. It is determined whether or not the node selected in step SA14 has plural outputs in the FF relation graph (SA15). When the node has plural outputs, the procedure proceeds to step SA20, and when not, the procedure returns to step SA13.

In step SA20, a balanced reconvergence path is searched for by assuming the node selected in step SA14 as a branch point. The search of a balanced reconvergence structure in this case is carried out similarly to so-called time expansion. Then, on the basis of the result of the search, the evaluation function of each FF to be used for sorting the FFs is weighted.

In step SA17, on the basis of the values of the evaluation functions calculated in steps SA14 through SA20, all the FFs are sorted in the ascending order of the evaluation function values. Then, all the FFs are replaced with scan FFs again (SA18).

FIG. 6 is a flowchart for showing detailed procedures in step SA20 of FIG. 5.

First, in assuming a current search point as 0, the node selected in step SA14 is disposed in the search point 0 as a branch point (SA21). Then, all nodes corresponding to first outputs from the branch point are disposed in a search point 1 (SA22). With the search point proceeded by one from the current search point (SA23), it is judged whether or not a predetermined search completing condition is satisfied (SA24). When the search completing condition is satisfied, the procedure of step SA20 is completed, and when not, the procedure proceeds to step SA25.

In step SA25, it is checked whether or not procedures of steps SA26 and SA27 have been executed on all nodes disposed in a current search point T. When it is determined that the procedures have been executed, the procedure proceeds to step SA28, and when not, the procedure proceeds to step SA26. In step SA26, one node not processed is selected among the nodes disposed in the current search point T, and all nodes corresponding to first outputs from the selected node are disposed in a search point T+1 (SA27).

In the step SA28, it is checked whether or not a node corresponding to a reconvergence point is involved in the nodes disposed in the search point T+1. When such a node is involved, the procedure proceeds to step SA29, and when not, the procedure returns to step SA23.

In step SA29, it is checked whether or not procedures in steps SA30 and SA31 have been executed on all reconvergence points disposed in the search point T+1. When the procedures have been executed, the procedure returns to step SA23, and when not, the procedure proceeds to step SA30. In step SA30, one reconvergence point not processed is selected, so that the evaluation functions of FFs disposed on a reconvergence path extending from the branch point to the reconvergence point selected in step SA30 are weighted in accordance with calculation by a predetermined calculation formula (SA31).

Now, the method of design for testability of this embodiment will be described by using a specific circuit example in accordance with the flowcharts of FIGS. 4 through 6. In the following description, an FF relation graph as is shown in FIG. 7 is assumed to be obtained in step SA1 from an integrated circuit used as a target of the design for testability.

In the following description, n is assumed as 2 in step SA7. Specifically, an FF is determined to replace with a scan FF depending upon whether or not the integrated circuit has a "two-fold line-up structure". It is noted that n is herein assumed as "2" merely for the convenience of description and can be set at any other value.

Also, in step SA31, when an FF belongs to a reconvergence path of a j-stage 2-fold balanced reconvergence structure, the FF is weighted by (j×k). The calculation formula, (j×k), is set in consideration that test sequences are more difficult to generate as the depth j and the multiplicity k are larger in a reconvergence path. This calculation formula for obtaining a weight is set for the description of this embodiment and any other calculation formula can be used instead. Moreover, in step SA24, the maximum value of the search point is set at 6 as the search completing condition. Specifically, when sixth outputs from a branch point have been searched for, step SA20 is completed.

Figure 7:
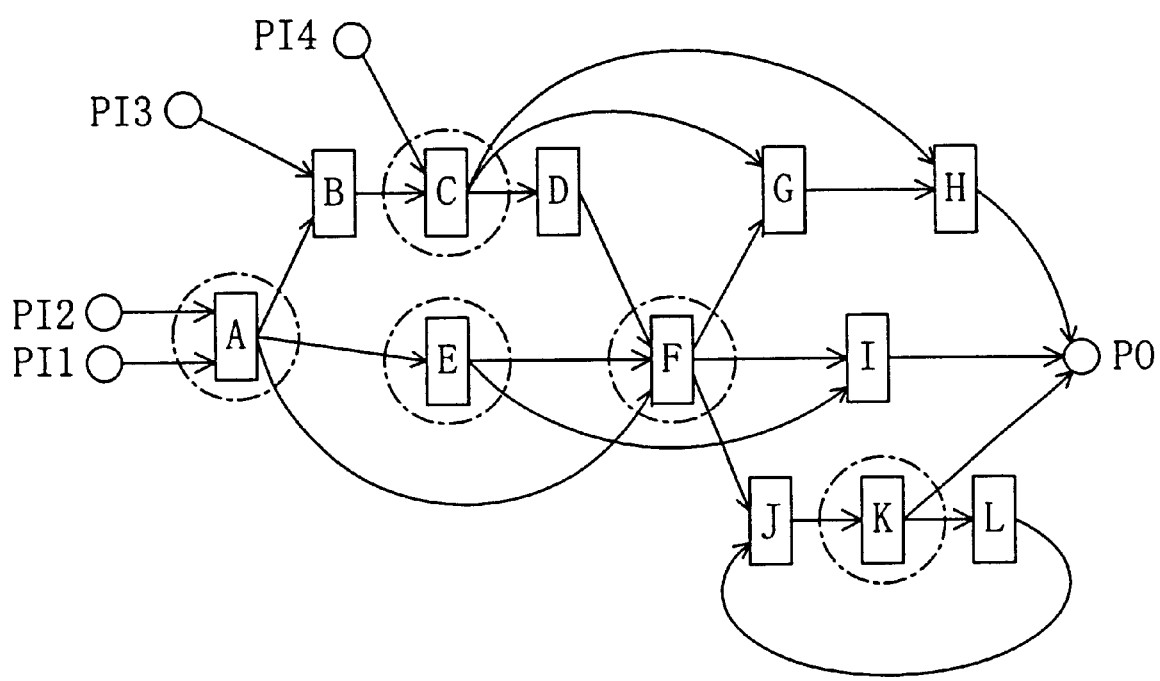
FIG. 7 is an FF relation graph representing an integrated circuit used as a target of design for testability in Embodiment 1.

First, in steps SA2 and SA3, all the FFs are replaced with scan FFs because there is no FF having self loops in the FF relation graph of FIG. 7.

Subsequently, the sorting process of step SA4 is executed. In the FF relation graph of FIG. 7, nodes, namely, FFs or primary inputs/outputs, having plural outputs are five nodes A, C, E, F and K. Specifically, in the sorting process of step SA4, these five nodes A, C, E, F and K are successively assumed as branch points for executing step SA20.

First, step SA20 is executed by assuming the node A as a branch point. FIGS. 8 through 13 are diagrams resulting from the execution of step SA20 with the node A assumed as a branch point.

Figures 8A, 8B:
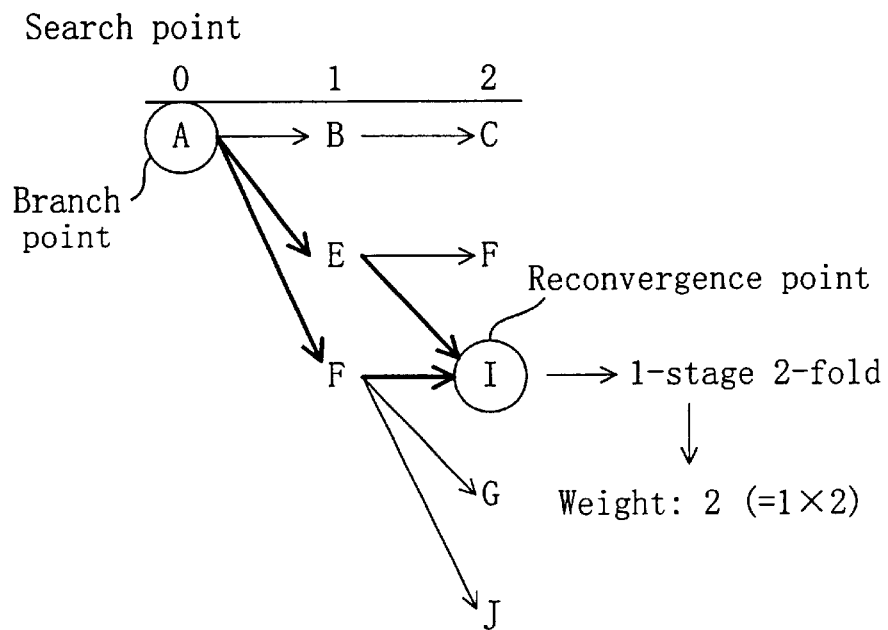
FIG. 8(a) is a directed graph for showing a result of search from a branch point A to a second output in the circuit of FIG. 7
FIG. 8(b) is a diagram for showing weights obtained on the basis of a balanced reconvergence structure recognized in FIG. 8(a)

As is shown in FIG. 8(a), a node disposed in the search point 0 is the node {A}, nodes disposed in the search point 1 are nodes {B, E, F}, and nodes disposed in the search point 2 are nodes {C, F, I, G, J}. At this point, the node I disposed in the search point 2 corresponds to a reconvergence point, and a one-stage two-fold balanced reconvergence structure having the branch point A and the reconvergence point I as is shown with thick arrows is recognized (SA28). As a result, as is shown in FIG. 8(b), the evaluation functions of the nods E and F disposed on the reconvergence paths included in this one-stage two-fold balanced reconvergence structure are weighted by 2 (=1×2) (SA31).

Figures 9A, 9B:
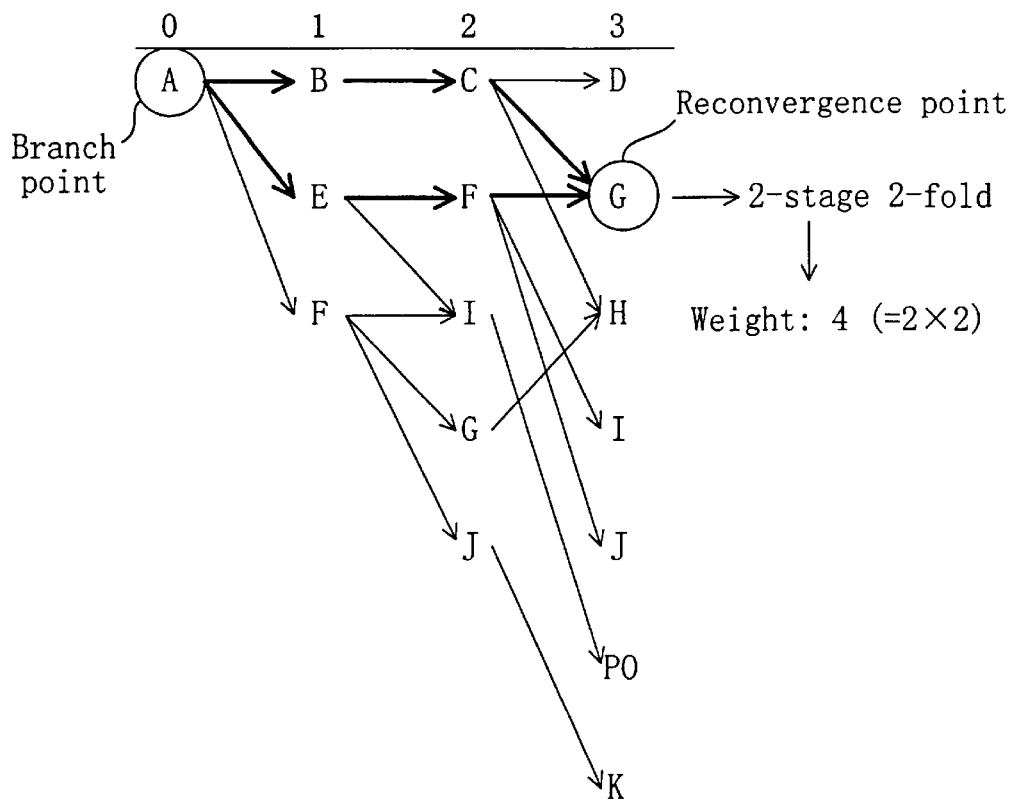
FIG. 9(a) is a directed graph for showing a result of search from the branch point A to a third output in the circuit of FIG. 7
FIG. 9(b) is a diagram for showing weights obtained on the basis of a balanced reconvergence structure recognized in FIG. 9(a)
Figures 10A, 10B:
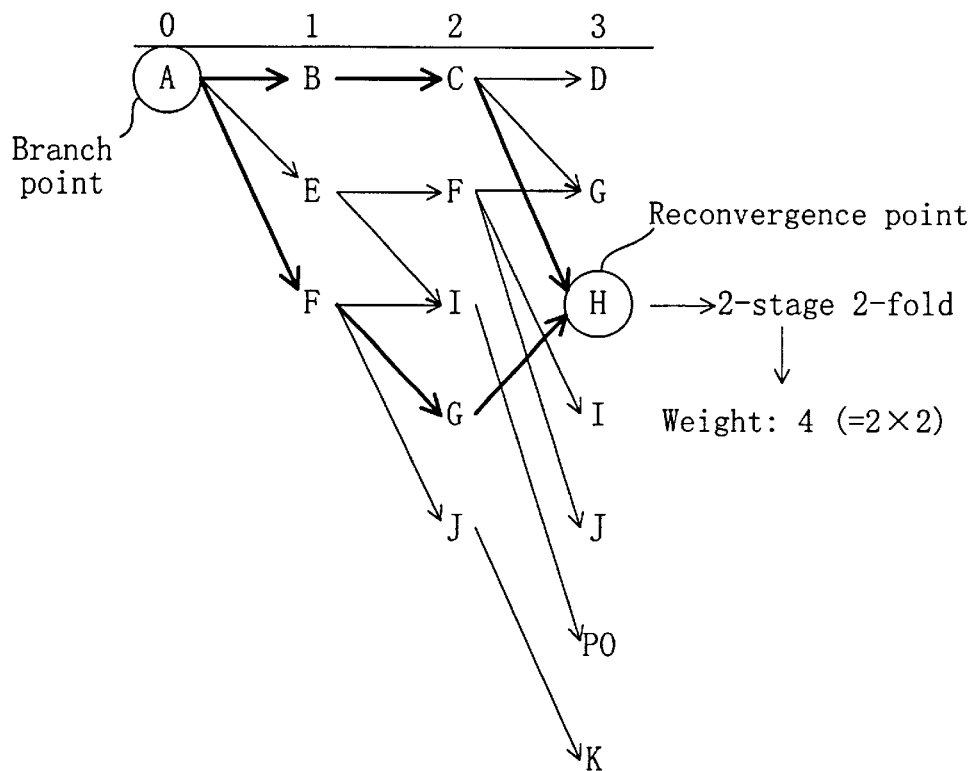
FIG. 10(a) is a directed graph for showing a result of search from the branch point A to another third output in the circuit of FIG. 7
FIG. 10(b) is a diagram for showing weights obtained on the basis of a balanced reconvergence structure recognized in FIG. 10(a)

Similarly, as is shown in FIGS. 9(a) and 9(b), a two-stage two-fold balanced reconvergence structure having the branch point A and the reconvergence point G is recognized, and the evaluation functions of the nodes disposed on the reconvergence paths included in this two-stage two-fold balanced reconvergence structure are weighted by 4 (=2×2). Furthermore, as is shown in FIGS. 10(a) and 10(b), a two-stage two-fold balanced reconvergence structure having the branch point A and the reconvergence point H is recognized, and the evaluation functions of nodes disposed on the reconvergence paths included in this two-stage two-fold balanced reconvergence structure are weighted by 4 (=2×2).

Figures 11A, 11B:
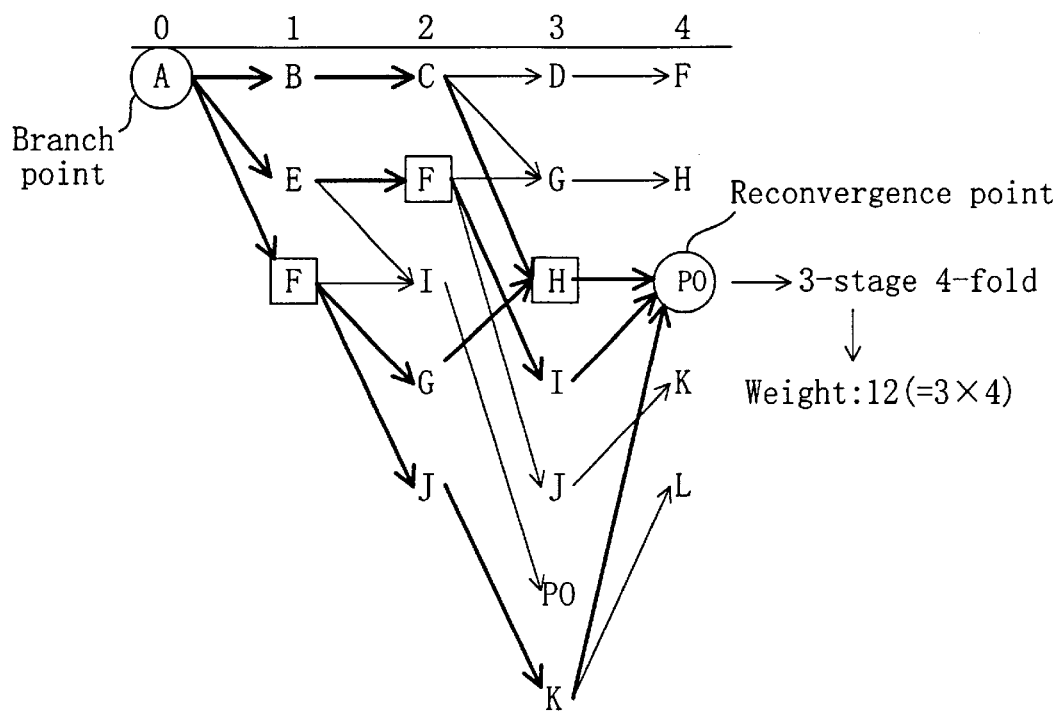
FIG. 11(a) is a directed graph for showing a result of search from the branch point A to a fourth output in the circuit of FIG. 7
FIG. 11(b) is a diagram for showing weights obtained on the basis of a balanced reconvergence structure recognized in FIG. 11(a)
Figures 12A, 12B:
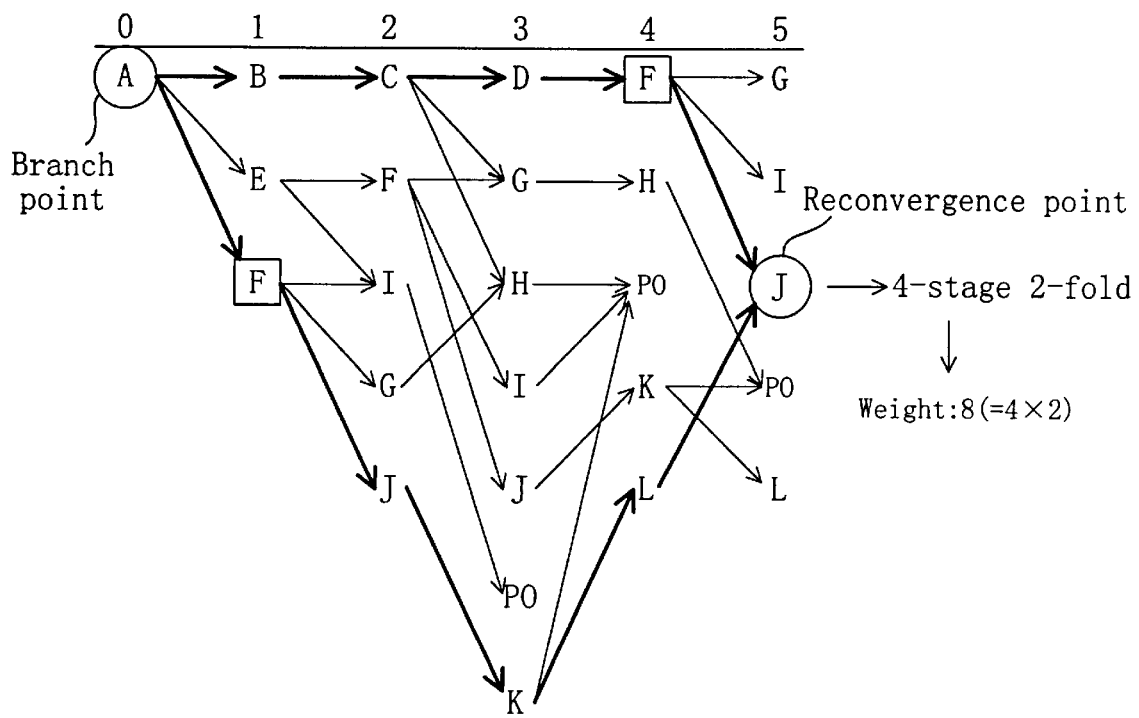
FIG. 12(a) is a directed graph for showing a result of search from the branch point A to a fifth output in the circuit of FIG. 7
FIG. 12(b) is a diagram for showing weights obtained on the basis of a balanced reconvergence structure recognized in FIG. 12(a)
Figures 13A, 13B:
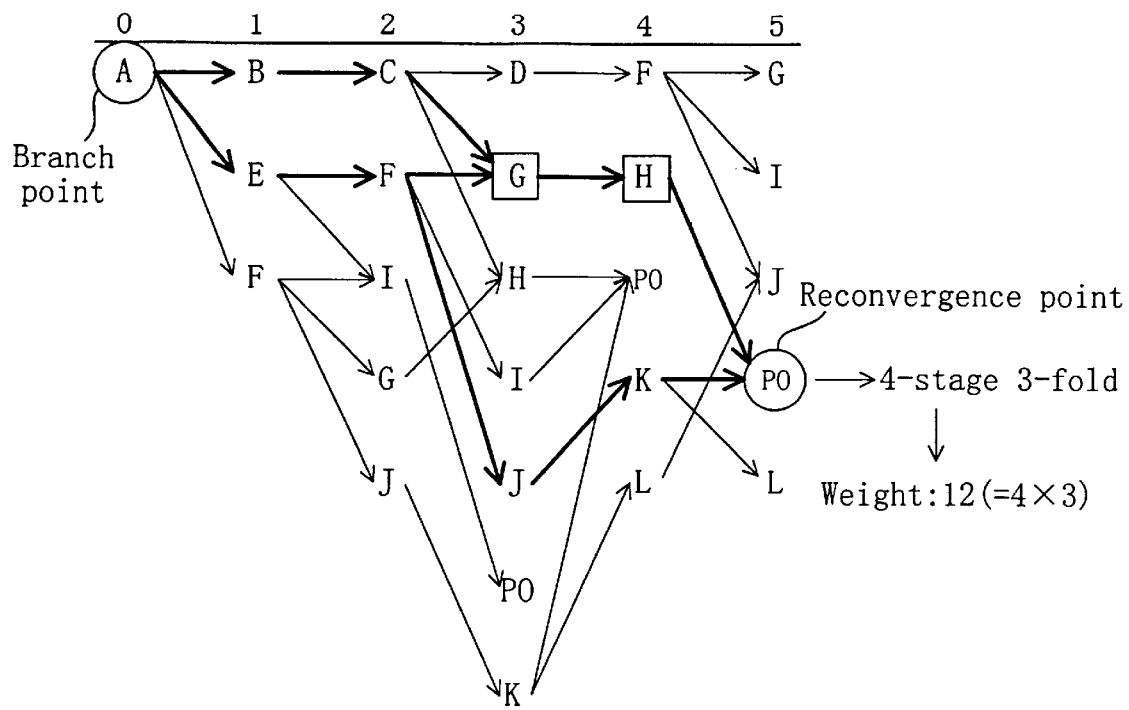
FIG. 13(a) is a directed graph for showing a result of search from the branch point A to another fifth output in the circuit of FIG. 7
FIG. 13(b) is a diagram for showing weights obtained on the basis of a balanced reconvergence structure recognized in FIG. 13(a)

Furthermore, as is shown in FIGS. 11(a) and 11(b), a three-stage four-fold balanced reconvergence structure having the branch point A and the reconvergence point PO is recognized, and the evaluation functions of nodes disposed on the reconvergence paths included in this three-stage four-fold balanced reconvergence structure are weighted by 12 (=3×4). However, since the nodes F and H belong to plural reconvergence paths, the evaluation functions of the nodes F and H are respectively weighted by 24 and 36, that is, values obtained by respectively multiplying the weight 12 by the numbers of reconvergence paths including the nodes (namely, 2 and 3 in this case). Also, as is shown in FIGS. 12(a) and 12(b), a four-stage two-fold balanced reconvergence structure having the branch point A and the reconvergence pont J is recognized, and the evaluation functions of nodes disposed on the reconvergence paths included in this four-stage two-fold balanced reconvergence structure are weighted by 8 (=4×2). However, similarly to the reconvergence structure shown in FIG. 11(a), since the node F belongs to plural reconvergence paths, the evaluation function of the node F is weighted by 16, that is, a value obtained by multiplying the weight 8 by the number of reconvergence paths including the node (namely, 2 in this case). Moreover, as is shown in FIGS. 13(a) and 13(b), a four-stage three-fold balanced reconvergence structure having the branch point A and the reconvergence pont PO is recognized, and the evaluation functions of nodes disposed on the reconvergence paths included in this four-stage three-fold balanced reconvergence structure are weighted by 12 (=4×3). However, similarly to the reconvergence structures of FIGS. 11(a) and 12(a), since the nodes G and H belong to plural reconvergence paths, each of the evaluation functions of the nodes G and H is weighted by 24, that is, a value obtained by multiplying the weight 12 by the number of reconvergence paths including the node (namely, 2 in this case).

Figure 14:
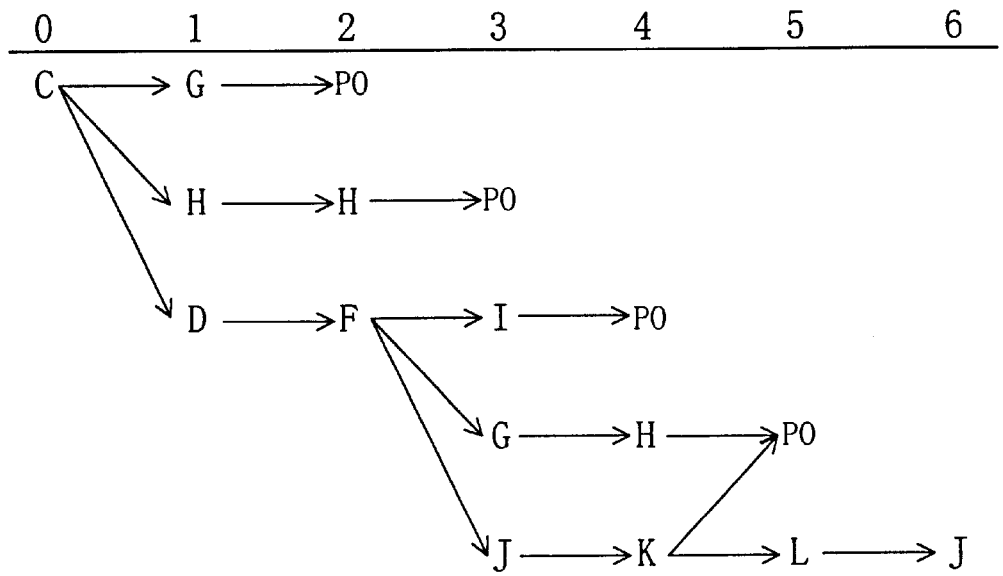
FIG. 14 is a directed graph for showing a result of search from a branch point C in the circuit of FIG. 7.
Figure 15:
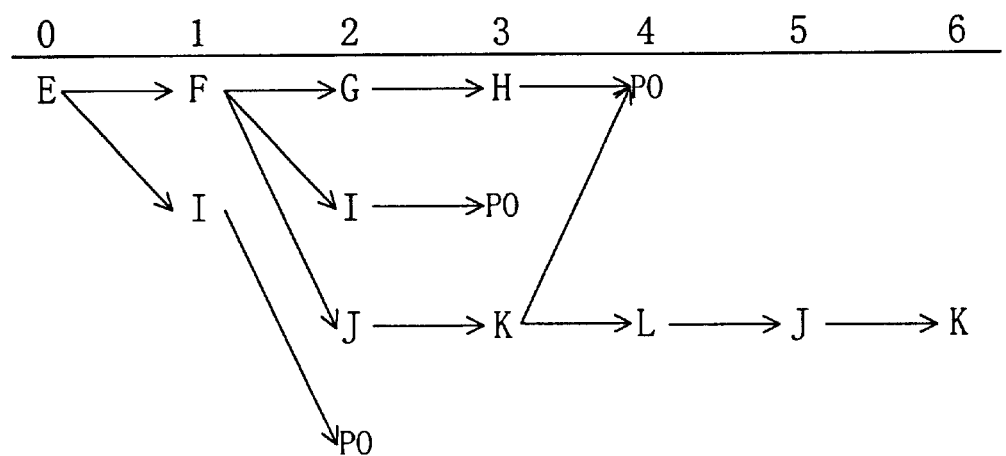
FIG. 15 is a directed graph for showing a result of search from a branch point E in the circuit of FIG. 7.
Figures 16A, 16B:
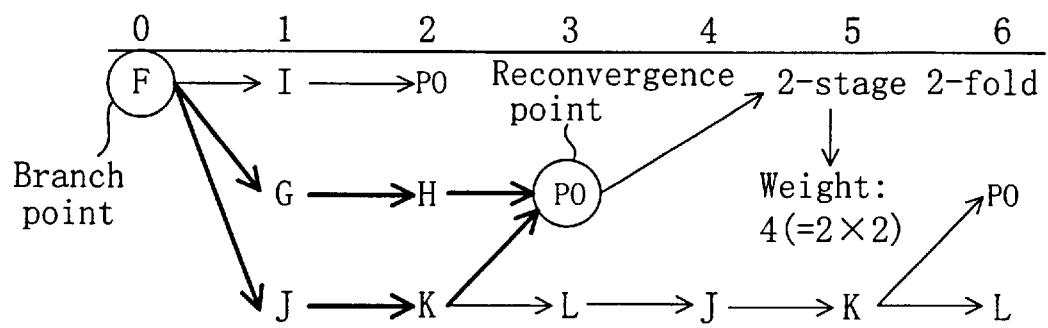
FIG. 16(a) is a directed graph for showing a result of search from a branch point F in the circuit of FIG. 7
FIG. 16(b) is a diagram for showing weights obtained on the basis of a balanced reconvergence structure recognized in FIG. 16(a)
Figures 17, 18:
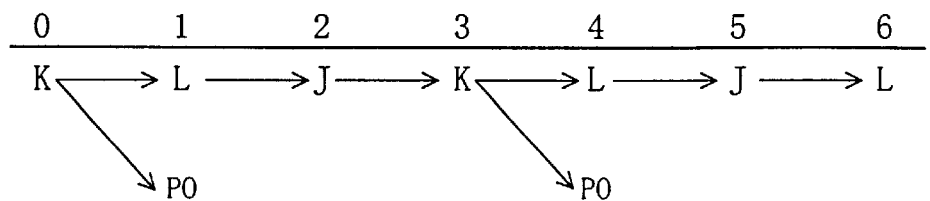
FIG. 17 is a directed graph for showing a result of search from a branch point K in the circuit of FIG. 7.
FIG. 18 is a diagram for showing values of evaluation functions and a sort order of FFs obtained from the search of balanced reconvergence structures in the circuit of FIG. 7.

FIGS. 14 through 17 are diagrams resulting from the execution of step SA20 with the other nodes C, E, F and K assumed as branch points, respectively. As is shown in FIGS. 14, 15 and 17, there is no balanced reconvergence structure having the node C, E or K as a branch point. On the other hand, as is shown in FIG. 16(a), a two-stage two-fold balanced reconvergence structure having the branch point F and the reconvergence point PO is recognized, and the evaluation functions of nodes disposed on the reconvergence paths included in this two-stage two-fold reconvergence structure are weighted by 4 (=2×2).

FIG. 18 is a diagram for listing the values of evaluation functions of the respective FFs obtained through the search of balanced reconvergence structures shown in FIGS. 8 through 17. When the FFs are sorted in the ascending order of the values of evaluation functions, the sort order is {A, D, L, I, E, J, K, B, C, G, H, F}. This order corresponds to the ascending order of the degree of relation with a balanced reconvergence structure indicated by the evaluation functions.

In steps SA5 through SA8, the scan FF identification is carried out in this sort order. Even when the nodes A, D, L, I, E and J are replaced with non-scan FFs, the circuit of FIG. 7 still has a two-fold line-up structure. However, when the node K is replaced with a non-scan FF, the nodes J, K and L together form a sequential circuit loop, resulting in spoiling the two-fold line-up structure. Accordingly, the node K is determined to replace with a scan FF. Furthermore, even when the node B is replaced with a non-scan FF, the circuit of FIG. 7 still has a two-fold line-up structure. However, when the node C is replaced with a non-scan FF, paths respectively having three sorts of sequential depths, specifically, a path with a sequential depth of 0 {A→PPOF}, a path with a sequential depth of 1 {A→E→PPOF} and a path with a sequential depth of 3 {A→B→C→D→PPOF}, are formed between the node A and a node PPOF (a pseudo primary input corresponding to the input of the node F replaced with a scan FF). Thus, the two-fold line-up structure of the circuit of FIG. 7 is spoiled. Accordingly, the node C is determined to replace with a scan FF. Similarly, the node F is determined to replace with a scan FF.

Figure 19:
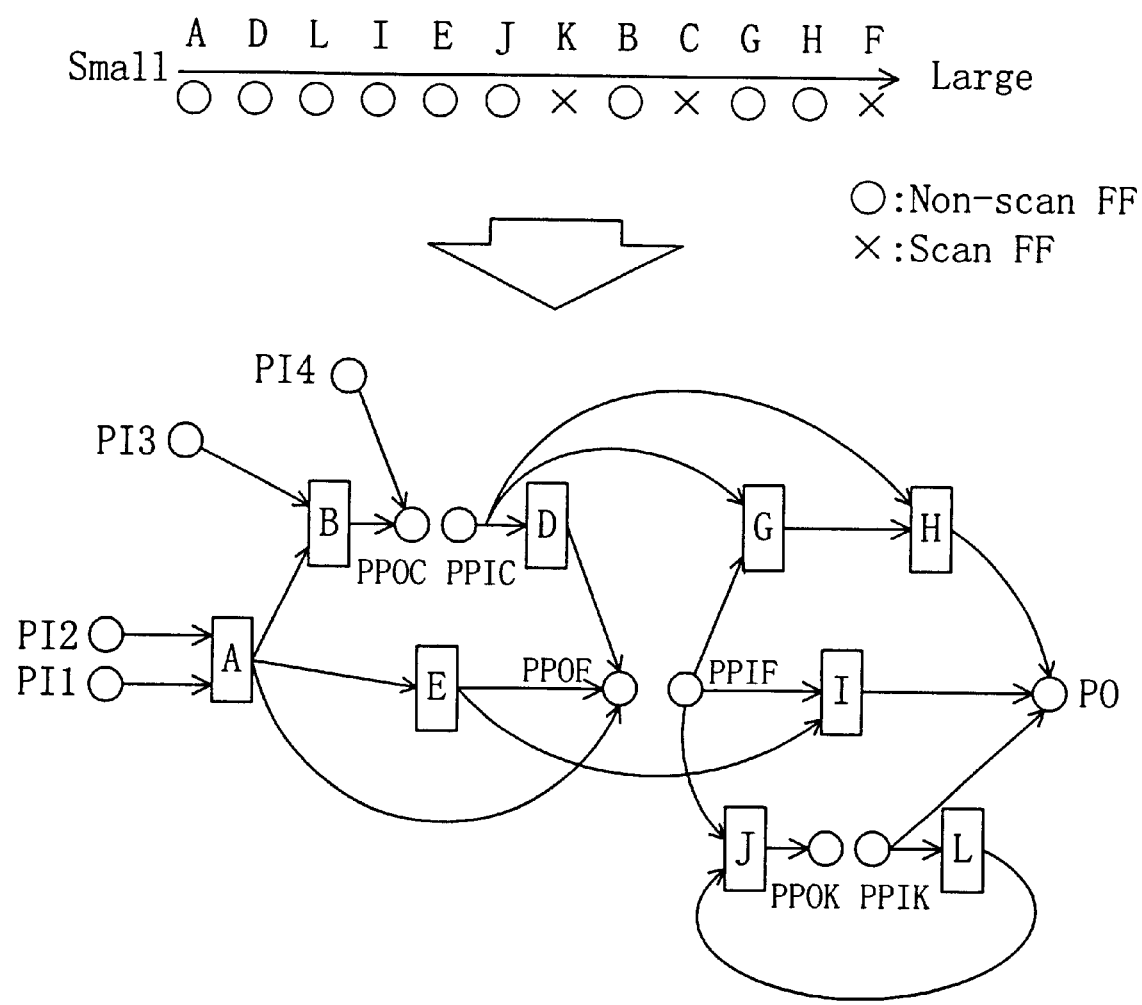
FIG. 19 is a diagram for showing a result of scan FF identification carried out in the sort order of FIG. 18.

As a result, in order to retain the two-fold line-up structure of the circuit of FIG. 7, the three FFs C, K and F are determined to replace with scan FFs as is shown in FIG. 19. The circuit of FIG. 19 includes no balanced reconvergence structure.

Figure 20:
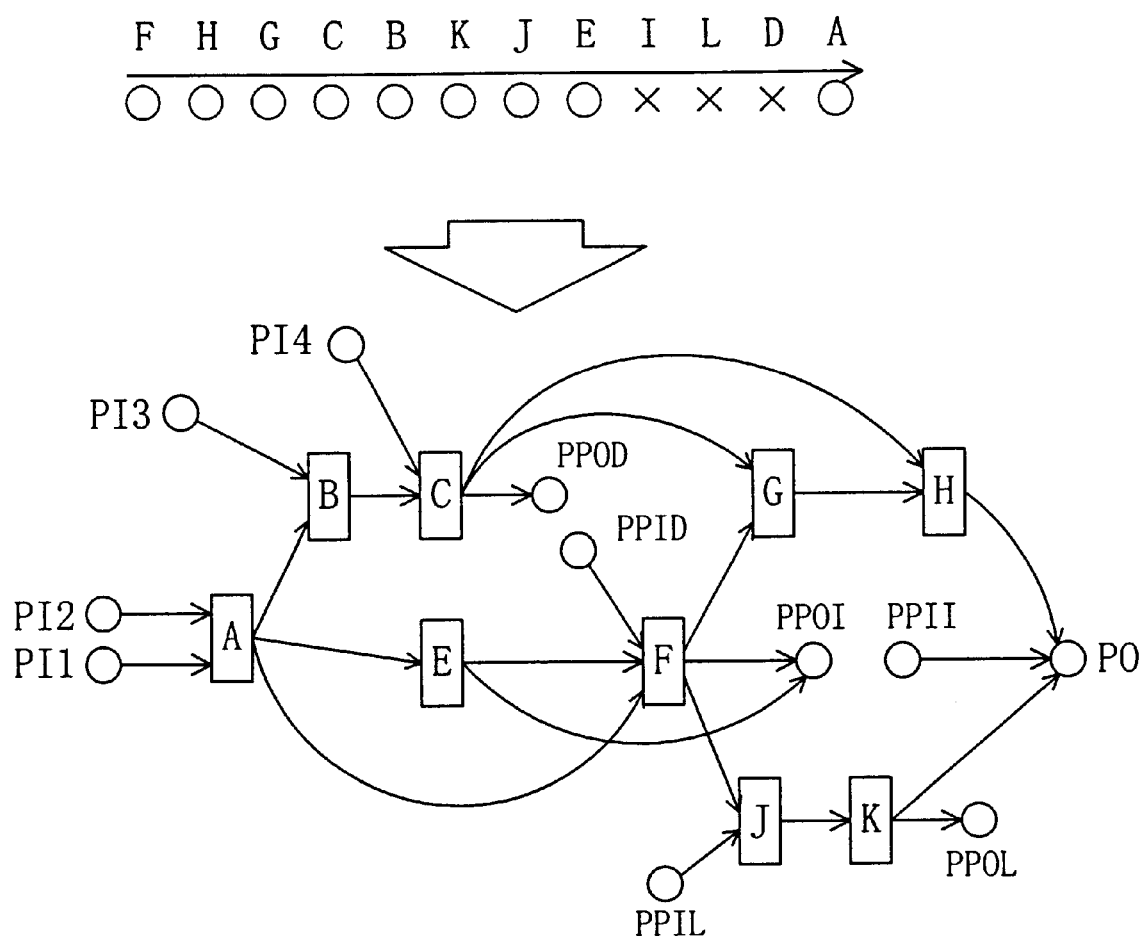
FIG. 20 is a diagram for showing a result of scan FF identification carried out in an order reverse to the sort order of FIG. 18 as a comparative example of Embodiment 1.

As a comparative example of this embodiment, the FFs are randomly selected for the scan FF identification, for example, the FFs are selected in the order of {F, H, G, C, B, K, J, E, I, L, D, A} reverse to the aforementioned sort order of the FFs. In this case, as is shown in FIG. 20, three FFs I, L and D are determined to replace with scan FFs in the circuit of FIG. 7.

Figure 21:
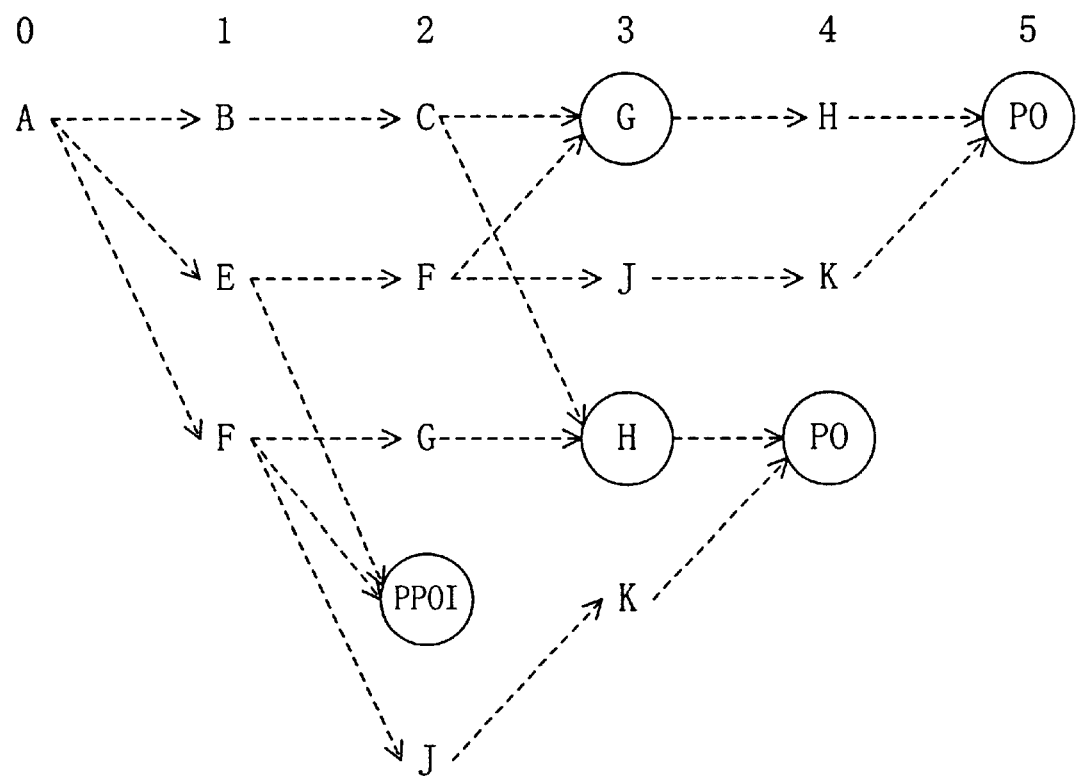
FIG. 21 is a diagram for showing a result of time expansion of the circuit of FIG. 20.

FIG. 21 is a diagram resulting from search for balanced reconvergence structure from the branch point A (and F). As is understood from FIG. 21, the circuit of FIG. 20 includes a one-stage two-fold balanced reconvergence structure from the branch point A to the node PPOI, a two-stage two-fold balanced reconvergence structure from the branch point A to the node G, a two-stage two-fold balanced reconvergence structure from the branch point A to the node H, three-stage three-fold balanced reconvergence structure and four-stage two-fold balanced reconvergence structure from the branch point A to the node PO, and a two-stage two-fold balanced reconvergence structure from the branch point F to the node PO. Specifically, this circuit includes six balanced reconvergence structures in total.

In this manner, in the design for testability according to this embodiment, an integrated circuit including a smaller number of reconvergence structures having large products of depths and multiplicities can be obtained than in the conventional technique. Accordingly, test sequences can be more easily generated and the fault efficiency can be improved.

In the above description, the product of the depth and the multiplicity, i.e., j×k, is used as the calculation formula for obtaining a weight for the evaluation function, but the calculation formula for obtaining a weight is not limited to this formula. The formula (j×k) is herein set in assuming that test sequences are more difficult to generate as the depth j and the multiplicity k are larger. Therefore, the formula (j×k) can be replaced with another calculation formula using j and k as variables, for example, a linear formula such as (ak+bj) wherein a and b are real numbers, or another polynomial formula. Also, together with or instead of the depth j and the multiplicity k, the number of reconvergence paths or the like can be used in the formula for obtaining a weight.

An n-fold line-up structure is an acyclic structure not including a global loop structure or a self loop structure. On the basis of this characteristics, the scan FF identification is omitted with respect to FFs having self loop structures and these FFs are unconditionally replaced with scan FFs in this embodiment. Similarly, it is possible to omit the scan FF identification with respect to FFs forming global loop structures by unconditionally replacing these FFs with scan FFs after recognizing a reconvergence path including a global loop structure.

Furthermore, on the basis of a characteristic that one node appears n times or less in time expansion of an n-fold line-up structure, the number of times of conducting the search can be decreased by limiting the number of times of appearance of one node in the search of outputs in step SA20.

EMBODIMENT 2

Figure 22:
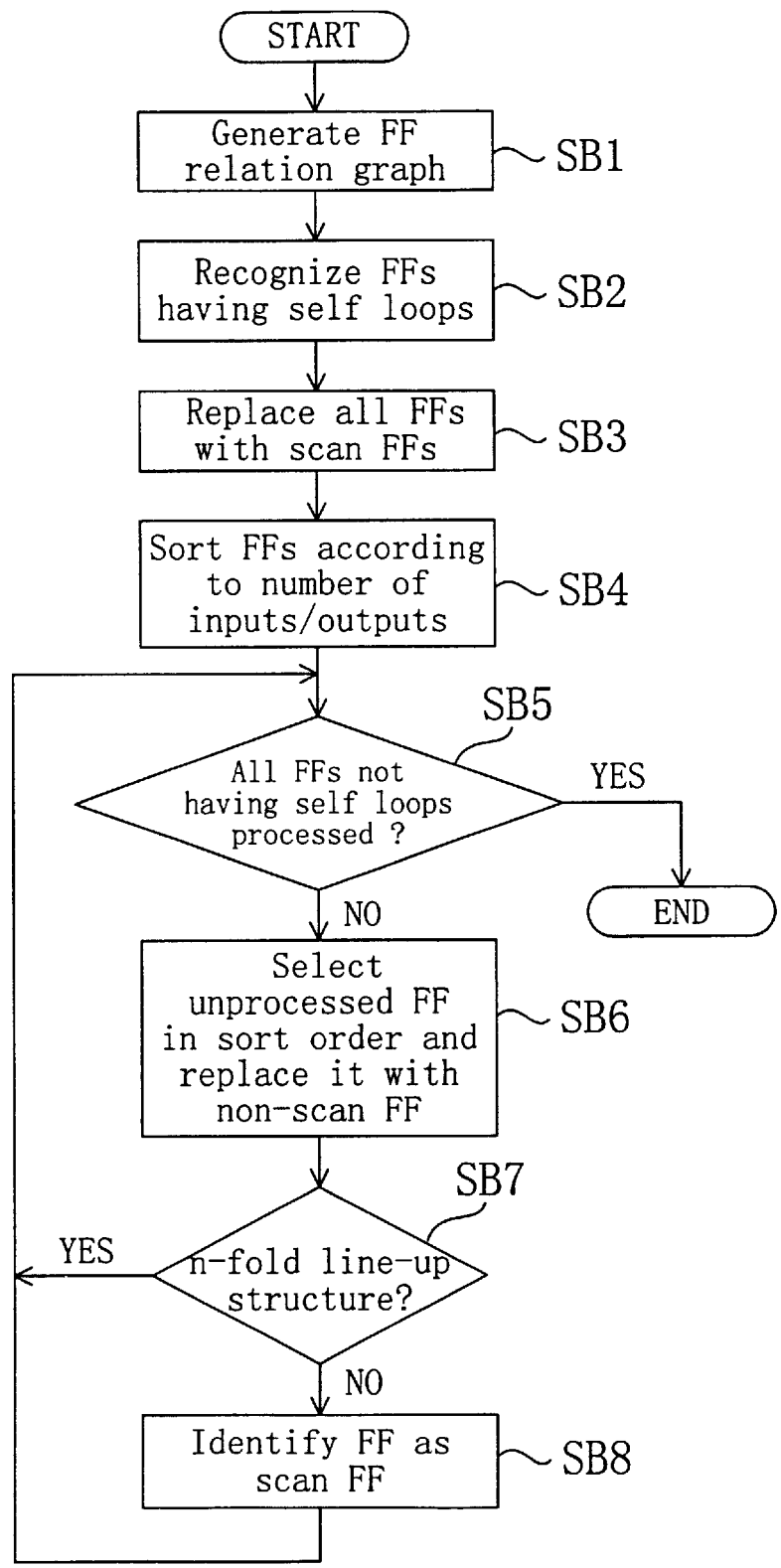
FIG. 22 is a flowchart of a method of design for testability according to Embodiment 2 of the invention.

FIG. 22 is a flowchart of a method of design for testability according to Embodiment 2 of the invention. The flowchart of FIG. 22 is the same as that of Embodiment 1 shown in FIG. 4 except for step SB4. In step SB4, FFs are sorted by using the number of inputs/outputs of each FF obtained in an FF relation graph representing an integrated circuit used as a target of the design as the evaluation function indicating the degree of relation with the difficulty in generating test sequences.

Figures 23A, 23B:
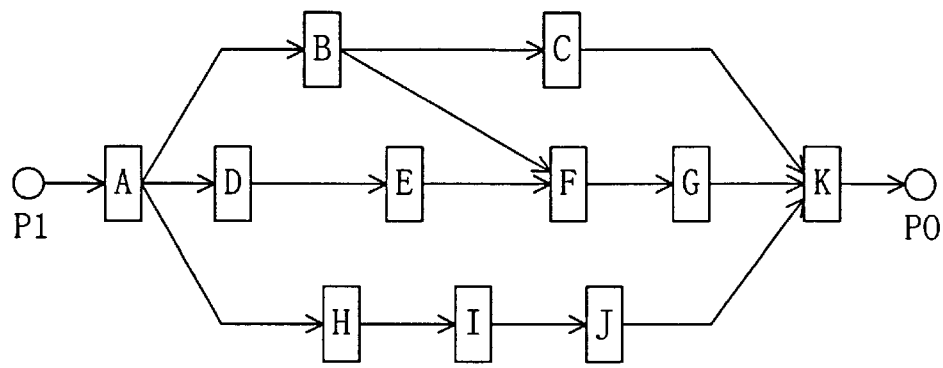
FIG. 23(a) is an FF relation graph representing an integrated circuit used as a target of design for testability in Embodiment 2 and FIG. 23(b) is a diagram for showing the number of inputs/outputs of each FF in the FF relation graph of FIG. 23(a) and a sort order obtained based on the number of inputs/outputs.

In this embodiment, an FF relation graph as is shown in FIG. 23(a) is assumed to be obtained in step SB1. Also, in step SB7, n is assumed as 1. Specifically, FFs are determined to replace with scan FFs depending upon whether or not the integrated circuit has a "one-fold line-up structure". It is noted that n is herein assumed as 1 for the convenience of description and can be set at any other value.

Figure 24:
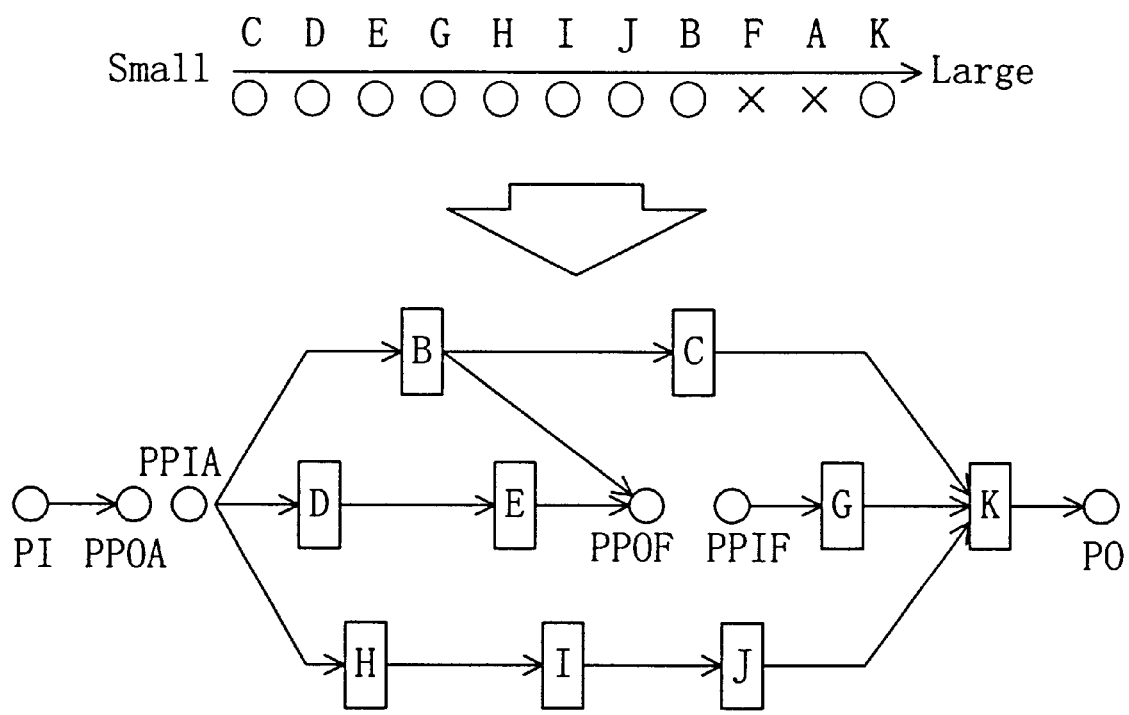
FIG. 24 is a diagram for showing a result of scan FF identification carried out in the sort order of FIG. 23(b)

FIG. 23(b) is a diagram for showing the numbers of inputs/outputs of respective FFs in the FF relation graph of FIG. 23(a). When the FFs are sorted in the ascending order of the numbers of inputs/outputs used as the evaluation functions, the sort order obtained in step SB4 is {C, D, E, G, H, I, J, B, F, A, K} as is shown in FIG. 23(b). This order corresponds to the ascending order of the degree of relation with a balanced reconvergence structure indicated by the evaluation function. When procedures in steps SB6 through SB8 are executed in this sort order, the two FFs F and A are determined to replace with scan FFs as is shown in FIG. 24.

Figure 25:
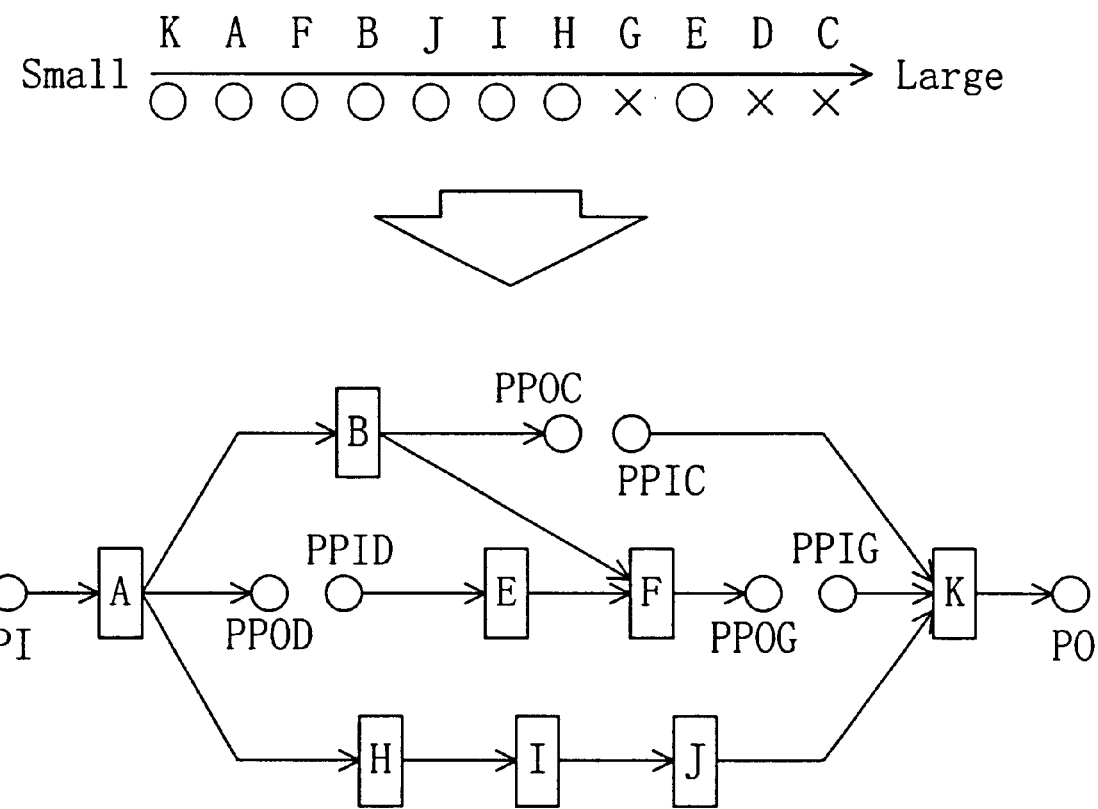
FIG. 25 is a diagram for showing a result of scan FF identification carried out in an order reverse to the sort order of FIG. 23(b) as a comparative example of Embodiment 2.

On the other hand, as a comparative example of this embodiment, the order of selecting FFs for the scan FF identification is randomized, for example, to be reverse to the aforementioned sort order, namely, the order of {K, A, F, B, J, I, H, G, E, D, C}. In this case, the three FFs G, D and C are determined to replace with scan FFs as is shown in FIG. 25.

In this manner, according to this embodiment, the number of FFs to replace with scan FFs can be reduced than in the conventional technique, resulting in preventing area increase of a test circuit.

EMBODIMENT 3

Figure 26:
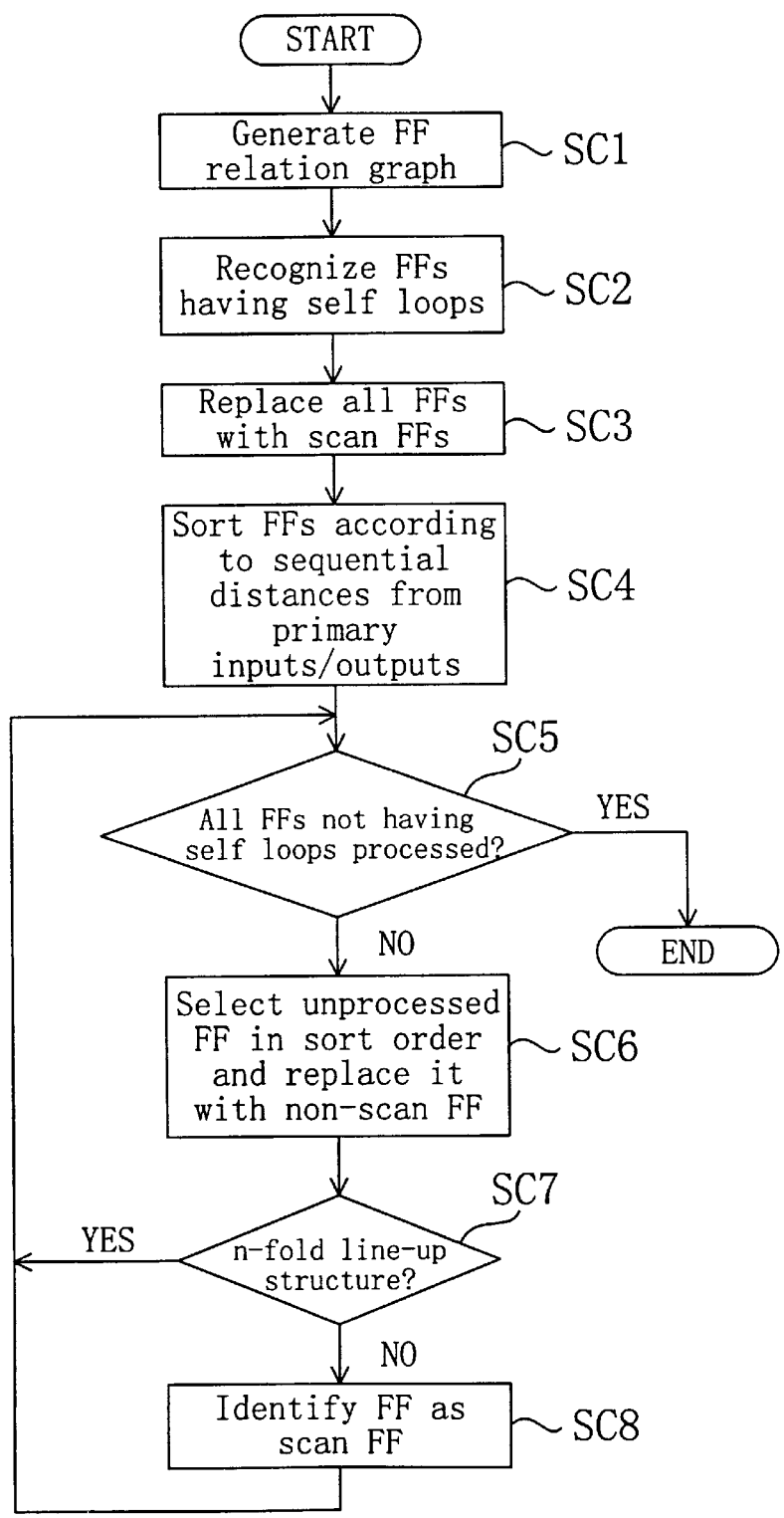
FIG. 26 is a flowchart of a method of design for testability according to Embodiment 3 of the invention.

FIG. 26 is a flowchart of a method of design for testability according to Embodiment 3 of the invention. The flowchart of FIG. 26 is the same as that of Embodiment 1 shown in FIG. 4 except for step SC4. In step SC4, FFs are sorted by using, as evaluation functions indicating the difficulty in generating test sequences, results of a predetermined calculation using a maximum sequential input distance and a maximum sequential output distance.

Herein, a "maximum sequential input distance" of an FF is the maximum sequential depth among all paths from respective primary inputs to the FF, and a "maximum sequential output distance" of an FF is the maximum sequential depth among all paths from the FF to respective primary outputs. However, when there is a loop in a path from an FF to a primary input or output, the loop is ignored for the calculation.

In this embodiment, with the maximum sequential input distance indicated as X and the maximum sequential output distance indicated as Y, the result of the following calculation is used as the evaluation function:

$$(X+Y)/|X-Y| \qquad (1)$$

The calculation result obtained by this formula is larger as the sequential depth from a primary input is more approximate to the sequential depth from a primary output (specifically, as the FF is closer to the center of the path), and is larger as the path including the FF is longer.

Also, in step SC7, n is assumed as 1. Specifically, the FFs are determined to replace with scan FFs depending upon whether or not the integrated circuit has a "one-fold line-up structure". It is noted that n is herein assumed as "1" for the convenience of description and can be set at any other value.

Figures 27A, 27B:
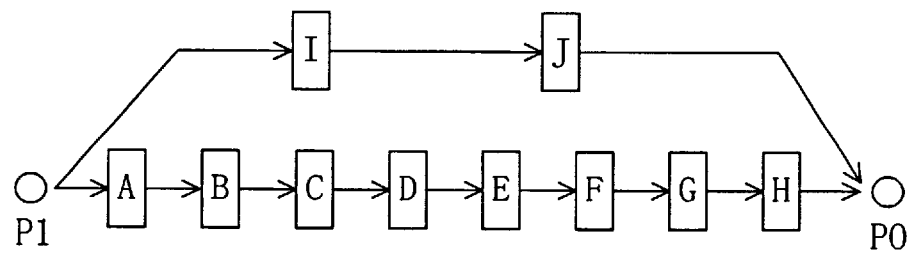
FIG. 27(a) is an FF relation graph representing an integrated circuit used as a target of design for testability in Embodiment 3 and FIG. 27(b) is a diagram for showing evaluation functions based on sequential distances of FFs in the FF relation graph of FIG. 27(a) and a sort order obtained based on the evaluation functions.
Figure 28:
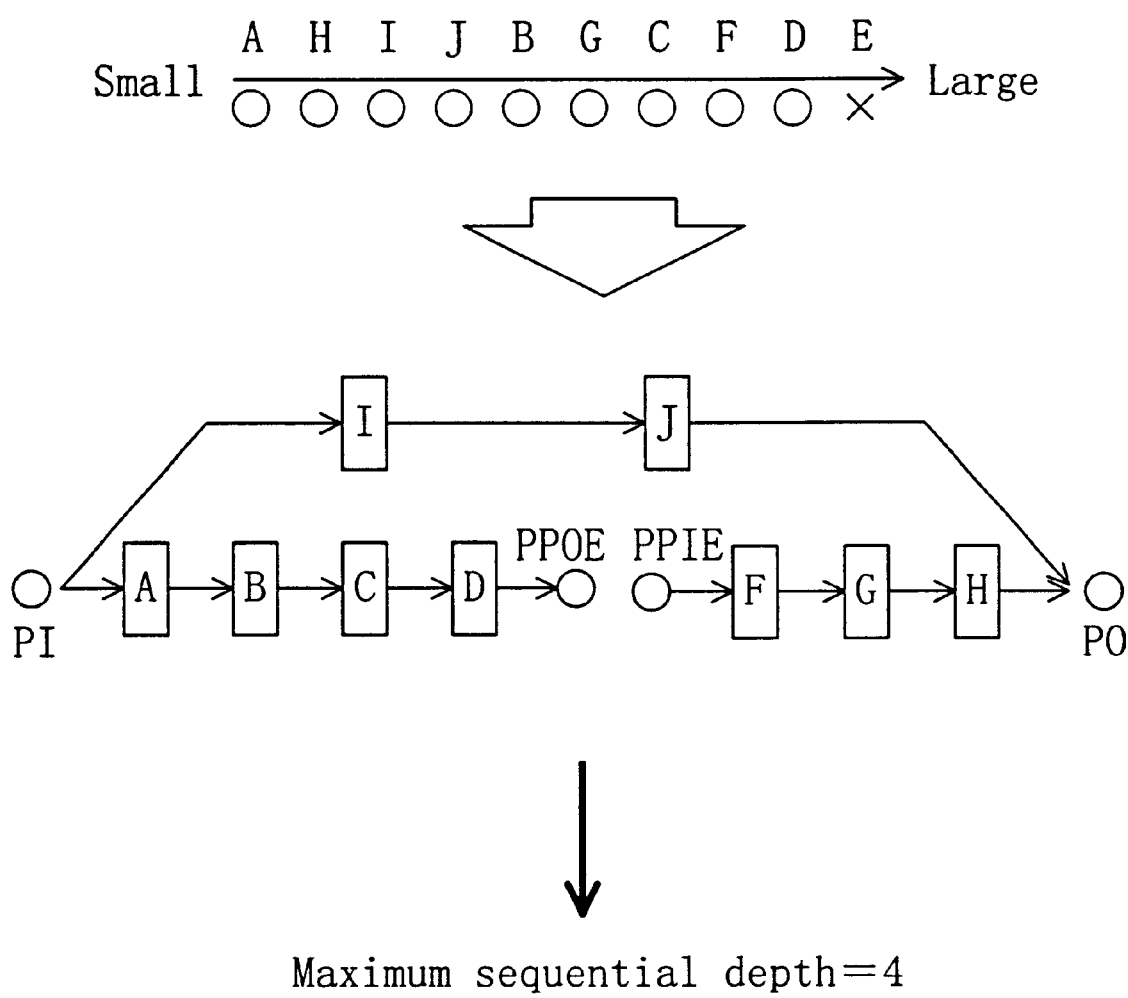
FIG. 28 is a diagram for showing a result of scan FF identification carried out in the sort order of FIG. 27(b)

First, in step SC1, an FF relation graph as is shown in FIG. 27(a) is assumed to be obtained from an integrated circuit used as a target of the design for testability. FIG. 27(b) is a diagram for showing the values of the evaluation functions of respective FFs in the FF relation graph of FIG. 27(a) obtained by using the formula (1). As is shown in FIG. 27(b), when the FFs are sorted in the ascending order of the evaluation functions, the sort order obtained in step SC4 is {A, H, I, J, B, G, C, F, D, E}. This order corresponds to the ascending order of the degree of relation with a balanced reconvergence structure indicated by the evaluation function. When procedures in steps SC6 through SC8 are executed in this sort order, the FF E is determined to replace with a scan FF as is shown in FIG. 28. A circuit shown in FIG. 28 has a sequential depth of 4.

Figure 29:
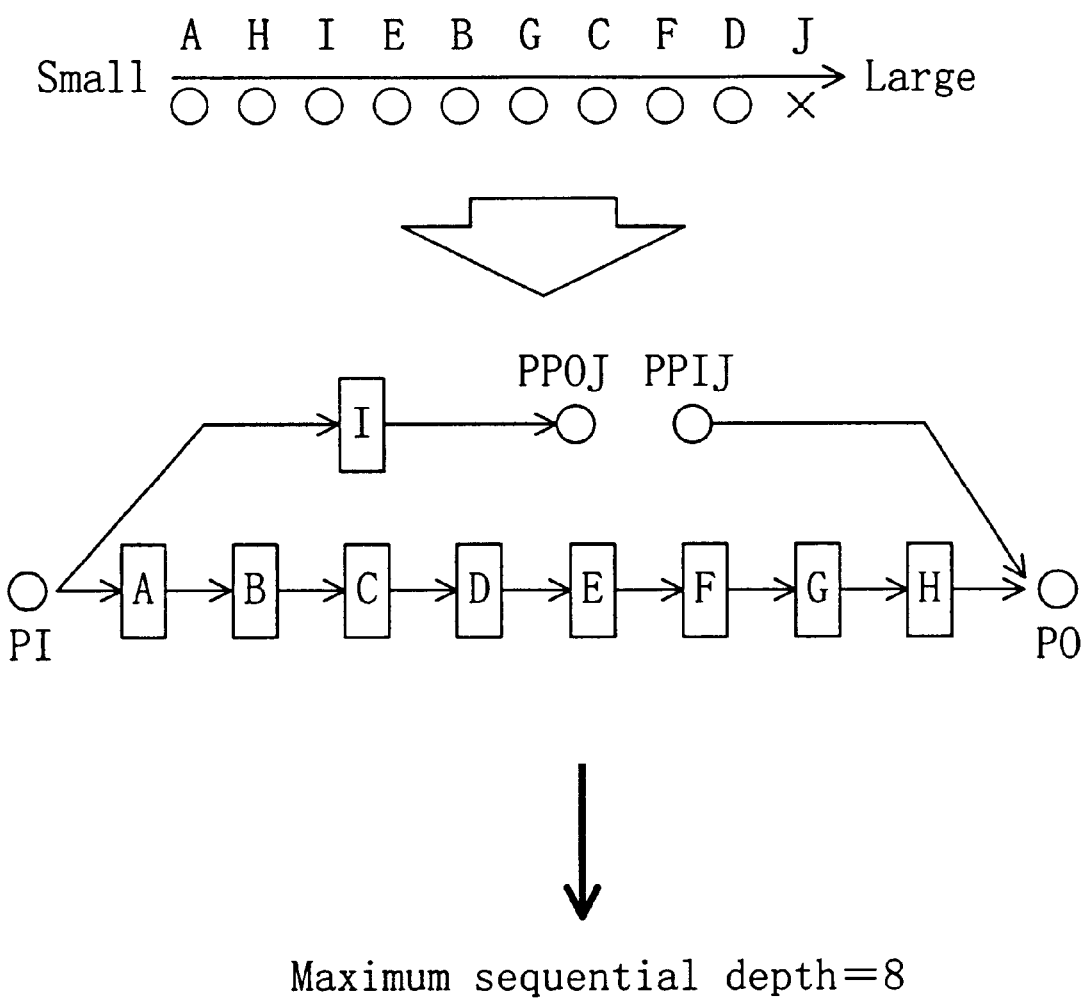
FIG. 29 is a diagram for showing a result of scan FF identification carried out in an order different from the sort order of FIG. 27(b) as a comparative example of Embodiment 3.

On the other hand, as a comparative example of this embodiment, the order in the scan FF identification is randomized to be, for example, the order of {A, H, I, E, B, G, C, F, D, J}. In this case, the FF J is determined to replace with a scan FF as is shown in FIG. 29. A circuit of FIG. 29 has a sequential depth of 8.

In this manner, according to this embodiment, the sequential depth of the resultant circuit is smaller than in the conventional technique, and hence, test sequences can be more easily generated. Moreover, the lengths of test sequences to be generated can be decreased.

The calculation formula used for obtaining the evaluation function is not limited to that described above but can be any other formula using the maximum sequential input distance and the maximum sequential output distance.

EMBODIMENT 4

Figure 30:
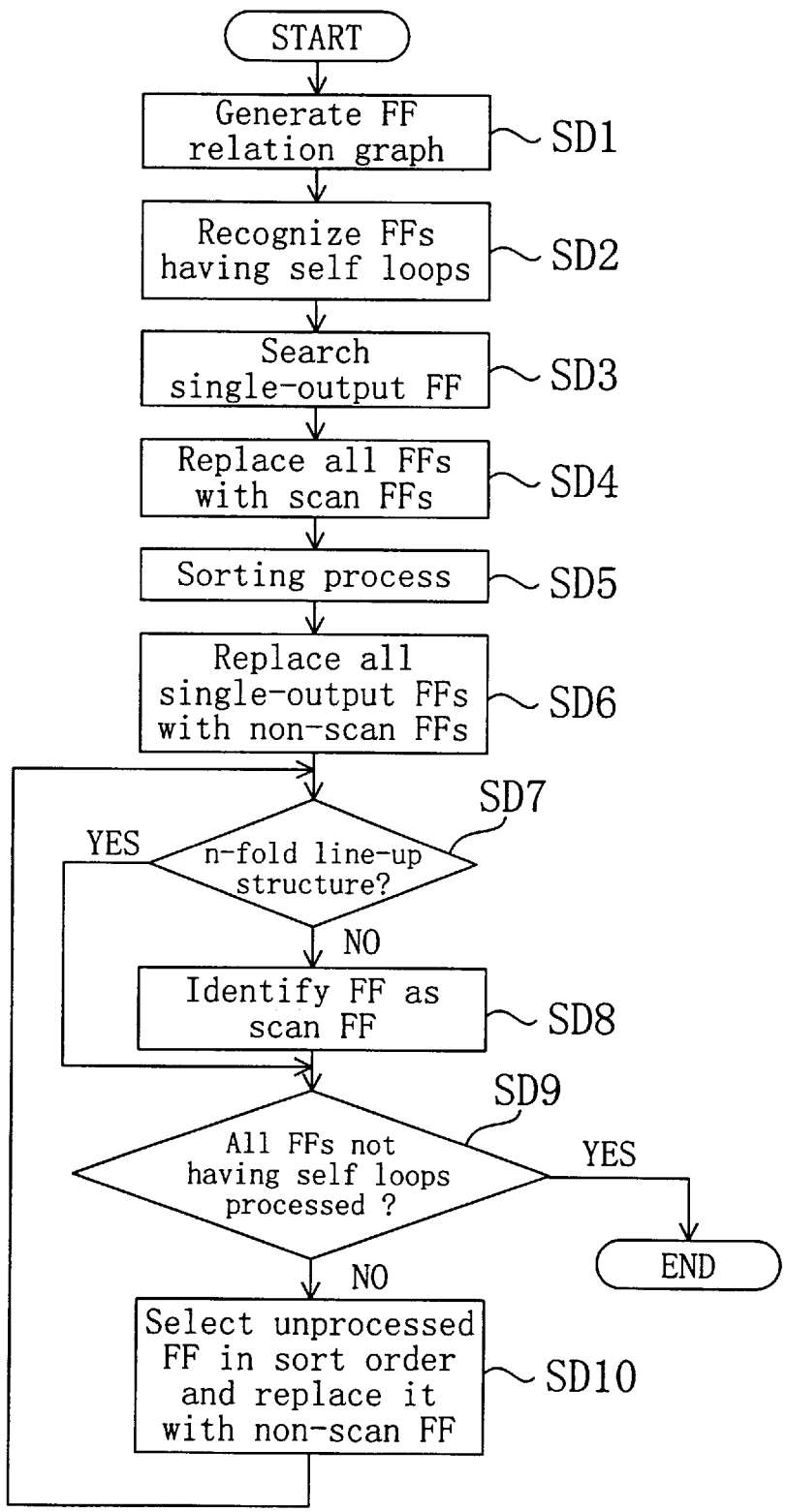
FIG. 30 is a flowchart of a method of design for testability according to Embodiment 4 of the invention.

FIG. 30 is a flowchart of a method of design for testability according to Embodiment 4 of the invention. As a characteristic of the flowchart of FIG. 30, single-output FFs are searched for and recognized in step SD3 and all the recognized single-output FFs are determined to replace with non-scan FFs in step SD6. Except for these procedures, the flowchart of FIG. 30 is the same as those of FIGS. 4, 22 and 26. Step SD5 is a sorting process corresponding to step SA4 of FIG. 4, step SB4 of FIG. 22 or step SC4 of FIG. 26.

Herein, a "single-output FF" is defined as an FF, used in an FF relation graph, having one output destination that is another FF or a primary output. In this embodiment, a single-output FF is not subjected to the scan FF identification but is unconditionally determined as a non-scan FF. In the sorting process in step SD5, respective FFs excluding FFs having self loop structures and single-output FFs are sorted in the same manner as in Embodiments 1 through 3.

In the algorithm for the scan FF identification described in Embodiments 1 through 3, each FF in the circuit is individually determined whether or not to replace with a scan FF. Therefore, when the number of FFs is large, the calculation takes a very long time. On the other hand, according to examination made by the present inventor, it is found that a circuit probably has an n-fold line-up structure even when all single-output FFs are replaced with non-scan FFs in a full scan circuit. Accordingly, when the scan FF identification of single-output FFs is omitted, the time required for the calculation for the scan FF identification can be largely decreased. In particular, the effect is remarkable when a circuit includes a large number of single-output FFs.

It is assumed that an FF relation graph of FIG. 7 is obtained in step SD1. In step SD3, FFs B, D, G, H, I, J and L are recognized as single-output FFs. Accordingly, the scan FF identification is executed on merely FFs A, C, E, F and K.

Although a single-output FF having one output destination is recognized in this embodiment, it is possible to expand the condition to an FF having m outputs (wherein m is a natural number) in general.

Alternatively, the scan FF identification can be omitted with respect to "single-input/output FFs" instead of "single-output FFs". A "single-input/output FF" is defined as a single-output FF having one input in an FF relation graph. In the FF relation graph of FIG. 7, the FFs D and L are single-input/output FFs.

When the FFs are sorted in accordance with the number of inputs/outputs as in Embodiment 2, a single-output FF having a larger number of inputs is positioned toward the back in the sort order. In such a case, when all single-output FFs are unconditionally determined to replace with non-scan FFs, a single-output FF in a position toward the back in the sort order is also replaced with a non-scan FF. This can result in spoiling the effect of sorting the FFs. In other words, although the effect to decrease the scan ratio can be attained by sorting the FFs in accordance with the numbers of inputs/outputs, the scan ratio can be increased by replacing all single-output FFs with non-scan FFs.

However, when the scan FF identification is omitted merely with respect to "single-input/output FFs", a single-output FF in a position toward the back in the sort order is subjected to the scan FF identification. Accordingly, the time required for calculation for the scan FF identification can be thus reduced, while the effect to decrease the scan ratio by sorting the FFs in accordance with the numbers of inputs/outputs cannot be spoiled.

EMBODIMENT 5

Figure 31:
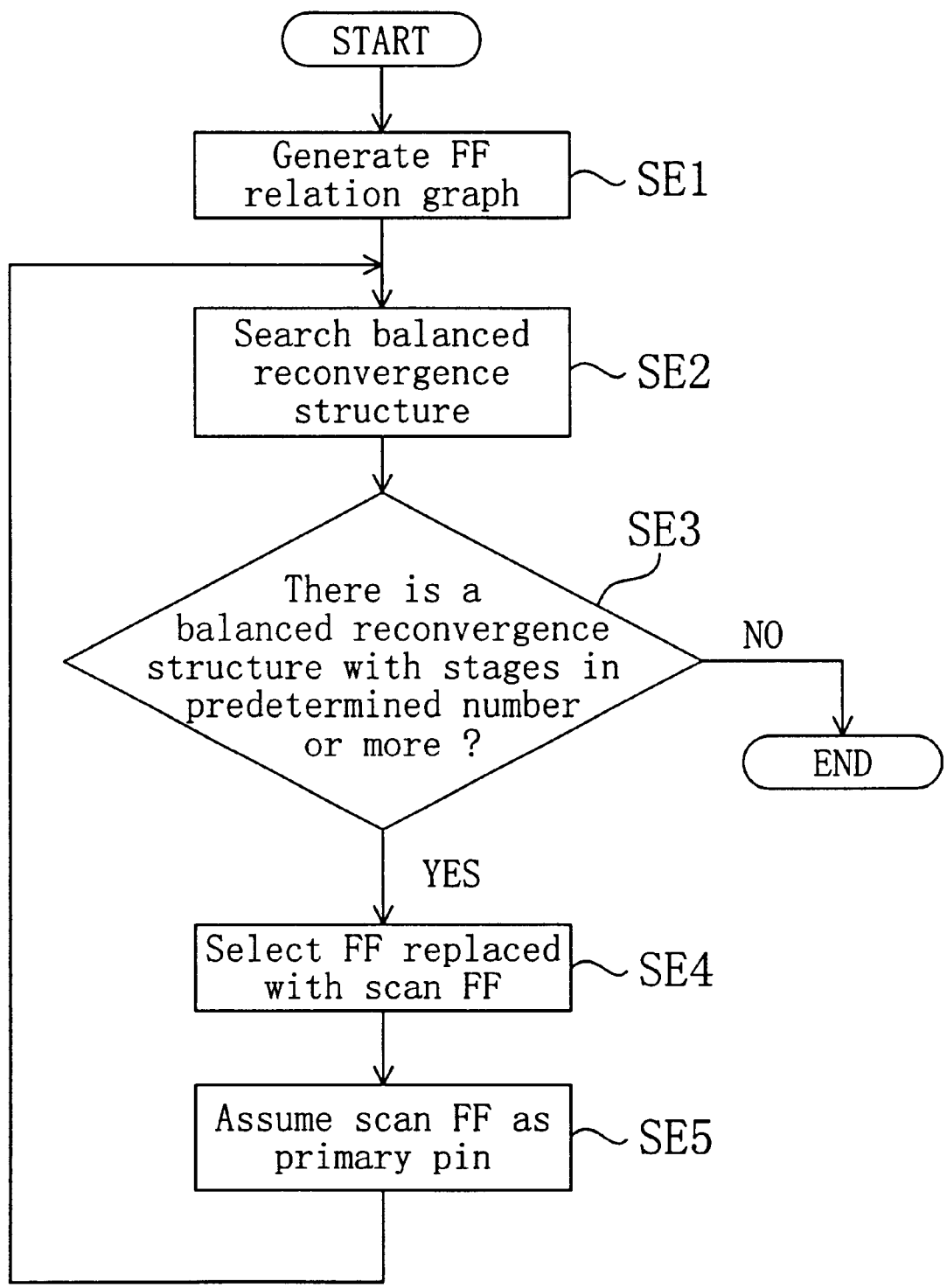
FIG. 31 is a flowchart of a method of design for testability according to Embodiment 5 of the invention.

FIG. 31 is a flowchart of a method of design for testability according to Embodiment 5 of the invention. In this embodiment, FFs to replace with scan FFs are identified so that a balanced reconvergence structure having a depth larger than a predetermined value can be deleted from an integrated circuit.

In the algorithm described in Embodiments 1 through 3, the scan FF identification is conducted so that an integrated circuit can have an n-fold line-up structure and that a balanced reconvergence structure can be eliminated as far as possible. However, since a balanced reconvergence structure is not positively deleted in this algorithm, a balanced reconvergence structure that can make it difficult to generate test sequences can remain in the circuit in some cases, and hence, high fault efficiency cannot be always achieved.

On the other hand, in a balanced reconvergence structure having a large depth, when there arises conflict in assigning values to branch points, generation of test sequences itself can be ended before conducting a backtracking process for the value assignment causing the conflict. Accordingly, when a balanced reconvergence structure having a large depth is deleted, the testability of the circuit can be improved, resulting in achieving high fault efficiency.

Figure 32:
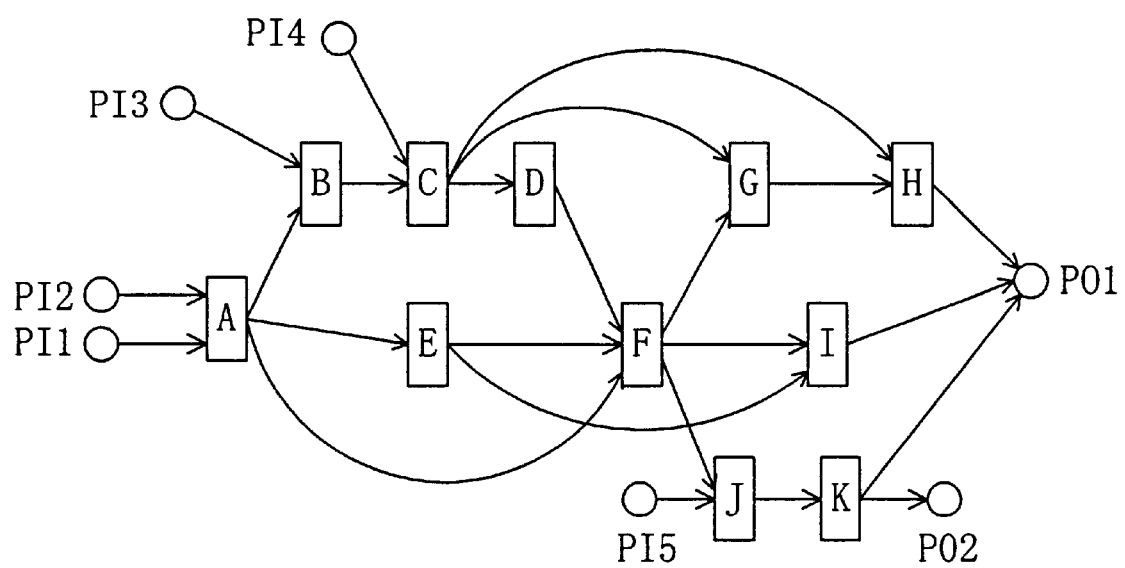
FIG. 32 is an FF relation graph representing an integrated circuit used as a target of design for testability in Embodiment 5.

First, in step SE1, it is assumed that an FF relation graph as is shown in FIG. 32 is obtained. In FIG. 32, PI1 through PI5 indicate primary inputs, A through K indicate FFs, and PO1 and PO2 indicate primary outputs.

Next, in step SE2, a balanced reconvergence structure is searched for. In FIG. 32, FFs that can work as a branch point of a balanced reconvergence structure are FFs A, C, E, F and K.

FIG. 33 is a diagram of a result of execution of step SE2, namely, balanced reconvergence structures existing in the circuit of FIG. 32. As is shown in FIG. 33, the circuit of FIG. 32 includes six balanced reconvergence structures. For example, "(A, I) (1, 2)" represents a one-stage two-fold balanced reconvergence structure from the branch point A to the reconvergence point I. Also, in FIG. 33, FFs belonging to the path of each balanced reconvergence structure are listed.

Then, in step SE3, it is determined whether or not the circuit of FIG. 32 includes a balanced reconvergence structure having a depth larger than a predetermined value. Herein, the predetermined value is assumed as "2". As is understood from FIG. 33, the circuit of FIG. 32 includes, as a balanced reconvergence structure having a depth of 2 or more, five balanced reconvergence structures (A, G) (2, 2), (A, H) (2, 2), (A, PO1) (3, 4), (A, PO1) (4, 3) and (F, PO1) (2, 2).

Next, in step SE4, an FF to replace with a scan FF is selected. In this selection, with regard to the balanced reconvergence structures having a depth of 2 or more, the number of paths including each FF is obtained to be used as a weight. FIG. 34 is a diagram of the weights of the respective FFs. Herein, the FF F having the largest weight is selected to replace with a scan FF.

Figure 35:
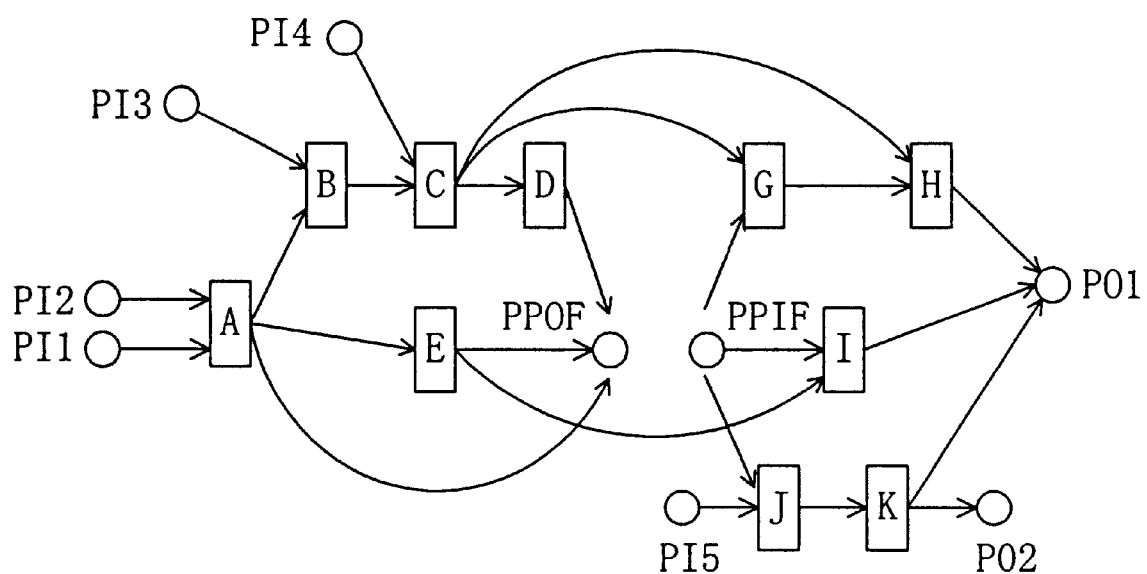
FIG. 35 is an FF relation graph obtained after replacing an FF F with a scan FF in the circuit of FIG. 32.

FIG. 35 is an FF relation graph obtained after selecting the FF F as a scan FF. In FIG. 35, the FF F identified as a scan FF is deleted from the FF relation graph, with the input of the FF F replaced with a pseudo primary output PPOF and the output thereof replaced with a pseudo primary input PPIF.

Then, the procedure returns to step SE2, and a balanced reconvergence structure is searched for in the circuit of FIG. 35. In FIG. 35, nodes that can work as a branch point of a balanced reconvergence structure are A, C, E, K and PPIF. As a result of the search, there is no balanced reconvergence structure having the FF A, C, E or K as a branch point, and merely a balanced reconvergence structure (PPIF, PO1) (2,2) can be recognized as is shown in FIG. 36. Subsequently, in step SE3, it is determined whether or not the circuit of FIG. 35 includes a balanced reconvergence structure having a depth of 2 or more. Since the balanced reconvergence structure (PPIF, PO1) (2, 2) is included, the procedure proceeds to step SE4.

In step SE4, an FF to replace with a scan FF is selected. As is shown in FIG. 37, all FFs included in the balanced reconvergence structure (PPIF, PO1) (2, 2) have a weight of 1, and hence, an FF to replace with a scan FF is randomly selected as the FF H.

Figure 38:
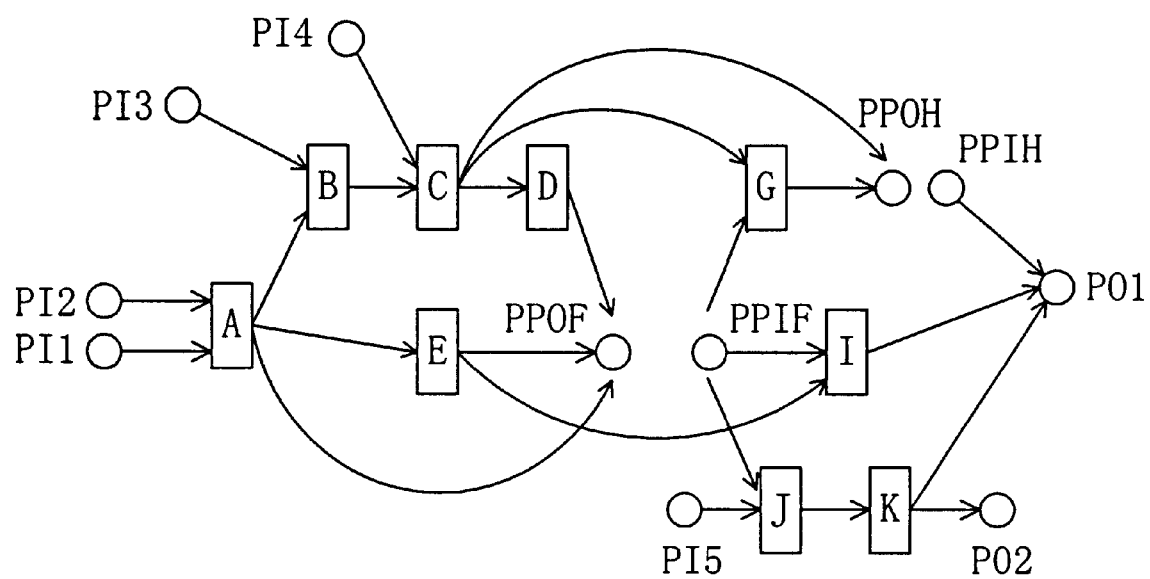
FIG. 38 is an FF relation graph obtained after replacing an FF H with a scan FF in the circuit of FIG. 35.

FIG. 38 is an FF relation graph obtained after selecting the FF H as an FF to replace with a scan FF. In FIG. 38, the FF H identified as a scan FF is deleted from the FF relation graph, with the input of the FF H replaced with a pseudo primary output PPOH and the output thereof replaced with a pseudo primary input PPIH. Then, in step SE2 again, a balanced reconvergence structure is searched for in the circuit of FIG. 38. In FIG. 38, nodes that can work as a branch point of a balanced reconvergence structure are A, C, E, K and PPIF. It is already found that there is no balanced reconvergence structure having the FF A, C, E or K as a branch point, and hence, the search is herein omitted. Therefore, a balanced reconvergence structure having the pseudo primary input PPIF as a branch point is searched for, but the circuit of FIG. 38 does not include such a balanced reconvergence structure. Accordingly, the process is completed through step SE3.

The selection of a scan FF conducted in step SE4 is not limited to that described above. For example, as an FF to replace with a scan FF, it is possible to select an FF that is included in a balanced reconvergence structure having a depth larger than a predetermined number as well as belongs to the largest number of balanced reconvergence structures in the entire circuit. Also, functions such as the depth of a balanced reconvergence structure, the number of paths and the number of FFs can be added to the selection function as a weight. Alternatively, plural FFs can be selected as FFs to replace with scan FFs.

EMBODIMENT 6

Figure 39:
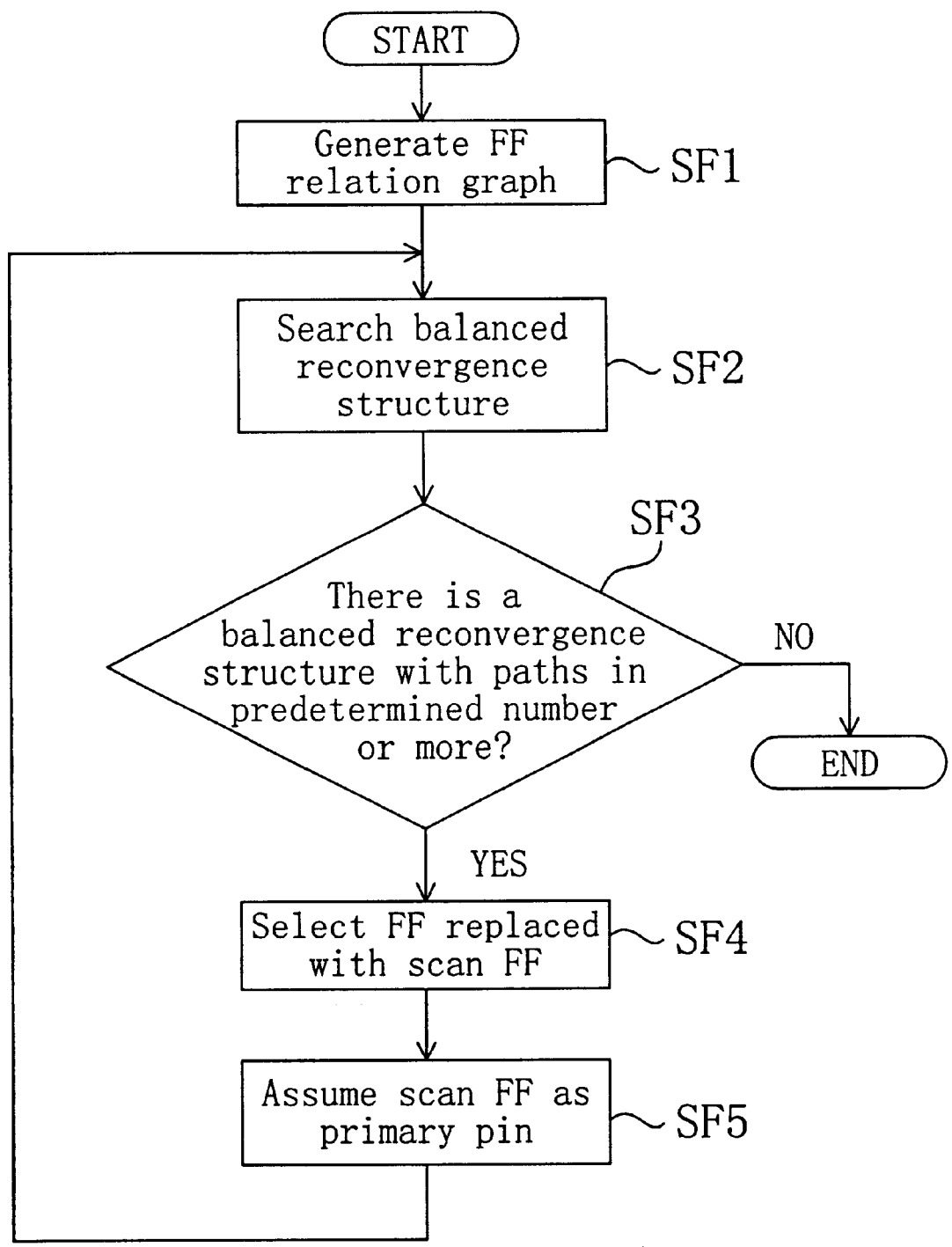
FIG. 39 is a flowchart of a method of design for testability according to Embodiment 6 of the invention.

FIG. 39 is a flowchart of a method of design for testability according to Embodiment 6 of the invention. The flowchart of FIG. 39 is basically the same as that of FIG. 31 except that it is determined whether or not there is a balanced reconvergence structure having "paths" in a predetermined number of more in step SF3. Specifically, in this embodiment, the scan FF identification is conducted that a balanced reconvergence structure having paths in a predetermined number or more can be deleted from an integrated circuit.

In a balanced reconvergence structure having a large number of paths, different values are more likely to be assigned to branch points, resulting in more likely causing conflict in a branch point. Accordingly, by decreasing the number of paths of a balanced reconvergence structure, the testability of a circuit can be improved, resulting in achieving high fault efficiency.

In step SF1, it is assumed that an FF relation graph of FIG. 32 is obtained.

Next, in step SF2, a balanced reconvergence structure is searched for. As a result, it is found that the circuit of FIG. 32 includes six balanced reconvergence structures as is shown in FIG. 33.

Then, in step SF3, it is determined whether or not the circuit of FIG. 32 includes a balanced reconvergence structure having paths in a predetermined number or more. Herein, the predetermined number is assumed as "3". Specifically, it is determined whether or not the circuit of FIG. 32 includes a balanced reconvergence structure having three or more paths. As is understood from FIG. 33, the circuit of FIG. 32 includes, as the balanced reconvergence structure having three or more paths, two balanced reconvergence structures (A, PO1) (3, 4) and (A, PO1) (4, 3).

Figure 40:
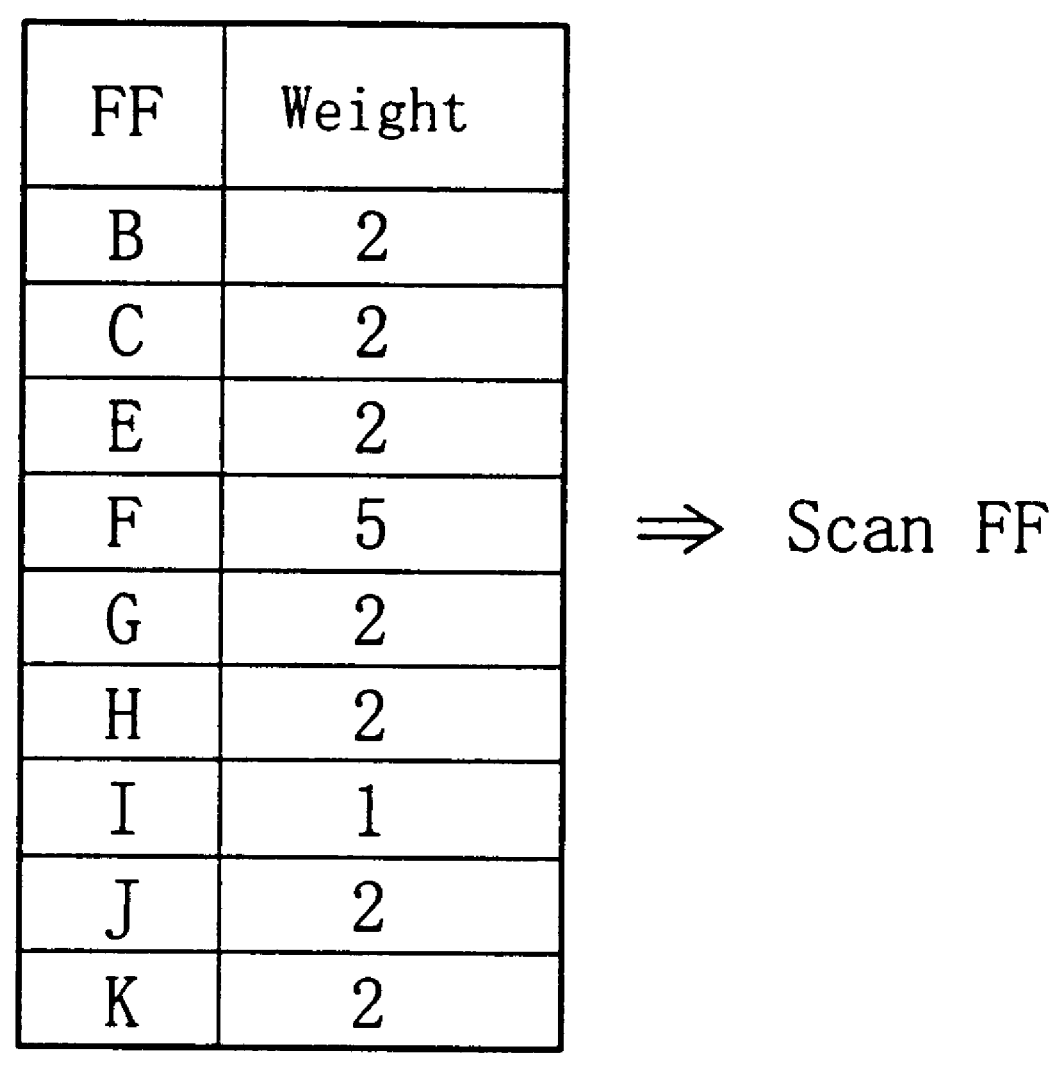

Subsequently, in step SF4, an FF to replace with a scan FF is selected. In this selection, the number of paths including each FF is obtained, to be used as a weight, in each of the two balanced reconvergence structure having three or more paths. FIG. 40 is a diagram for showing weights of the respective FFs. Herein, an FF having the largest weight, namely, the FF F is selected as an FF to replace with a scan FF.

FIG. 35 is an FF relation graph obtained after selecting the FF F as an FF to replace with a scan FF. Then, the procedure returns to step SF2, and a balanced reconvergence structure is searched for in the circuit of FIG. 35. As a result of the search, a balanced reconvergence structure (PPIF, PO1) (2, 2) alone is recognized. However, the number of paths of this balanced reconvergence structure is less than three. Accordingly, it is found that the circuit of FIG. 35 includes no balanced reconvergence structure having three or more paths, and hence, the process is completed through step SF3.

The selection of an FF to replace with a scan FF conducted in step SF4 is not limited to that described above. For example, as an FF to replace with a scan FF, it is possible to select an FF that is included in a balanced reconvergence structure having paths in a predetermined number or more as well as belongs to the largest number of balanced reconvergence structures in the entire circuit. Also, functions such as the depth of a balanced reconvergence structure, the number of paths and the number of FFs can be added to the selection function as a weight. Alternatively, plural FFs can be selected as FFs to replace with scan FFs.

EMBODIMENT 7

Figure 41:
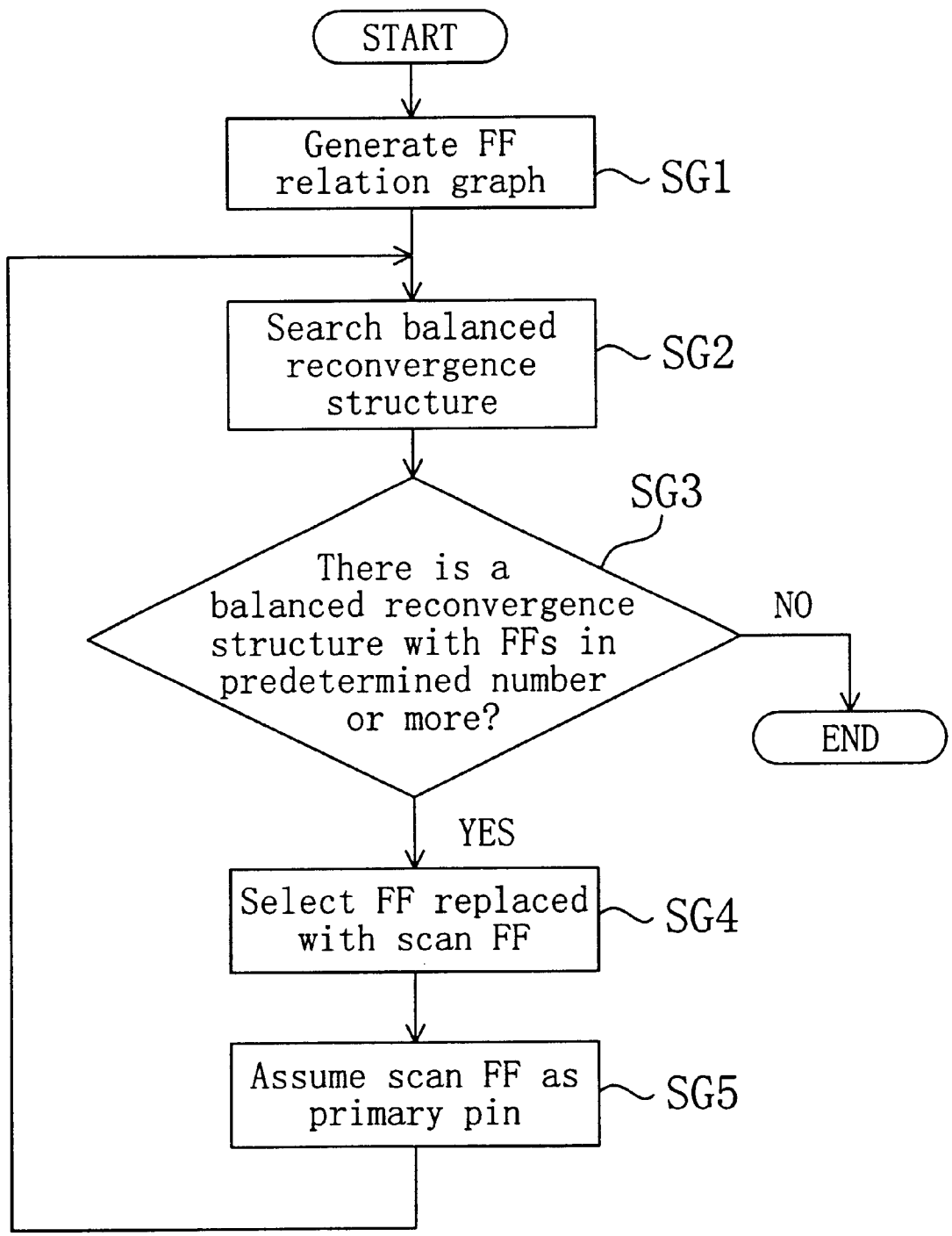
FIG. 41 is a flowchart of a method of design for testability according to Embodiment 7 of the invention.

FIG. 41 is a flowchart of a method of design for testability according to Embodiment 7 of the invention. The flowchart of FIG. 41 is basically the same as that of FIG. 31 except that it is determined whether or not there is a balanced reconvergence structure including "FFs" in a predetermined number or more in step SG3. Specifically, in this embodiment, the scan FF identification is conducted so that a balanced reconvergence structure including a predetermined number or more FFs can be deleted from an integrated circuit.

In a balanced reconvergence structure including a large number of FFs, the number of paths is large and the depth is probably large. Therefore, conflict can be caused in a branch point, and hence, a backtracking process is more likely to be ended. Accordingly, by decreasing the number of FFs included in a balanced reconvergence structure, the testability of a circuit can be improved, resulting in achieving high fault efficiency.

Figure 42:
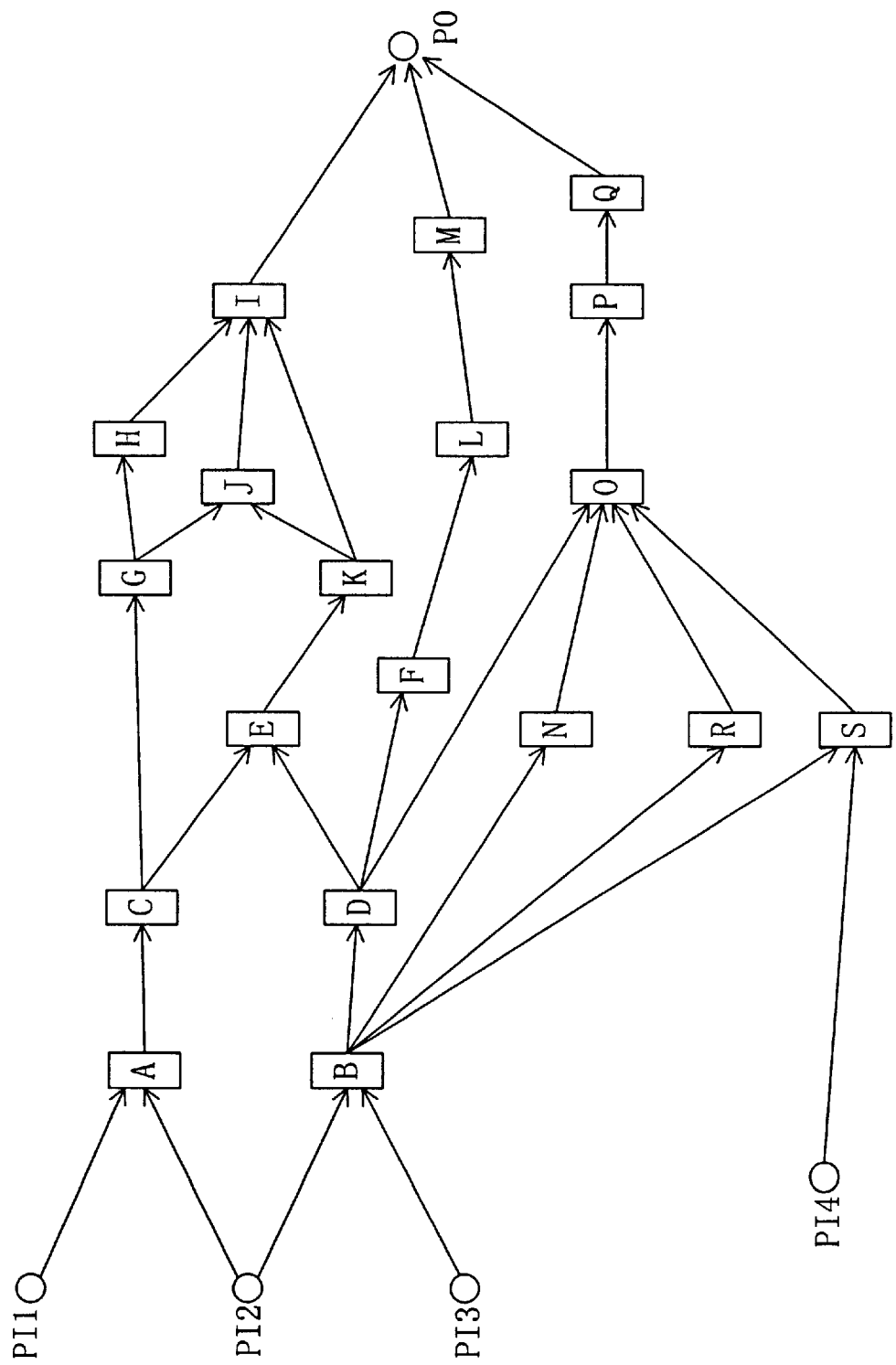
FIG. 42 is an FF relation graph representing an integrated circuit used as a target of design for testability in Embodiment 7.

In step SG1, it is assumed that an FF relation graph of FIG. 42 is obtained. In FIG. 42, PI1 through PI4 indicate primary inputs, A through S indicate FFs, and PO indicates a primary output. Next, in step SG2, a balanced reconvergence structure is searched for. In FIG. 42, nodes that can work as a branch point of a balanced reconvergence structure are PI2, B, C, D, G and K. FIG. 43 is a diagram for showing a result of execution of step SG2, namely, balanced reconvergence structures present in the circuit of FIG. 42. As is shown in FIG. 43, there are six balanced reconvergence structures in the circuit of FIG. 42. Also, FIG. 43 lists FFs and the number of FFs belonging to the path of each balanced reconvergence structure.

Next, in step SG3, it is determined whether or not the circuit of FIG. 42 includes a balanced reconvergence structure including FFs in a predetermined number or more. Herein, the predetermined number is assumed as "8". As is understood from FIG. 43, the circuit of FIG. 42 includes two balanced reconvergence structures (PI2, PO) (5, 9) and (D, PO) (3, 3) as the balanced reconvergence structures including eight or more FFs.

Then, in step SG4, an FF to replace with a scan FF is selected. In this selection, with regard to each balanced reconvergence structure including eight or more FFs, the number of paths including each FF is obtained to be used as a weight. FIG. 44 is a diagram for showing the weights of the respective FFs. In this case, the FF B having the largest weight is selected as an FF to replace with a scan FF.

Figure 45:
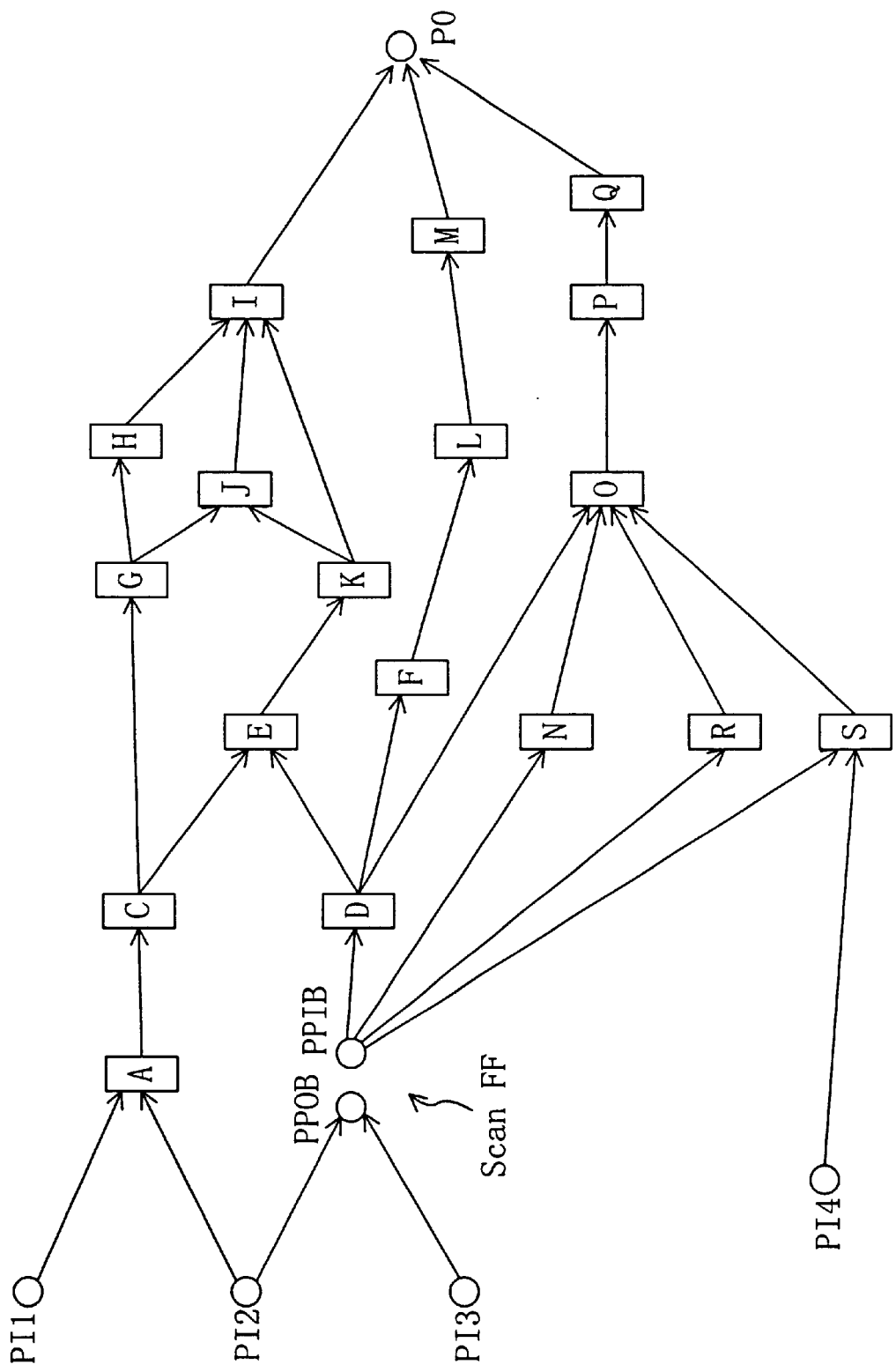
FIG. 45 is an FF relation graph obtained after replacing an FF B with a scan FF in the circuit of FIG. 42.

FIG. 45 is an FF relation graph obtained after selecting the FF B as an FF to replace with a scan FF. In FIG. 45, the FF B identified as a scan FF is deleted from the FF relation graph, with the input of the FF B replaced with a pseudo primary output PPOB and the output thereof replaced with a pseudo primary input PPIB.

Then, the procedure returns to step SG2, and a balanced reconvergence structure is searched for in the circuit of FIG. 45. As a result of the search, four balanced reconvergence structures are recognized as is shown in FIG. 46. In step SG3, since a balanced reconvergence structure (D, PO) (3, 3) includes nine FFs, it is determined that there is a balanced reconvergence structure including eight or more FFs, and the procedure proceeds to step SG4.

In step SG4, an FF to replace with a scan FF is selected. As is shown in FIG. 47, the weights of all the FFs included in the balanced reconvergence structure (D, PO) (3, 3) are 1. Therefore, FFs also belonging to other balanced reconvergence structures are selected, among which an FF to replace with a scan FF is randomly selected. The FFs K and E also belong to another balanced reconvergence structure (C, I) (2, 3), between which the FF K is selected as an FF to replace with a scan FF.

Figure 48:
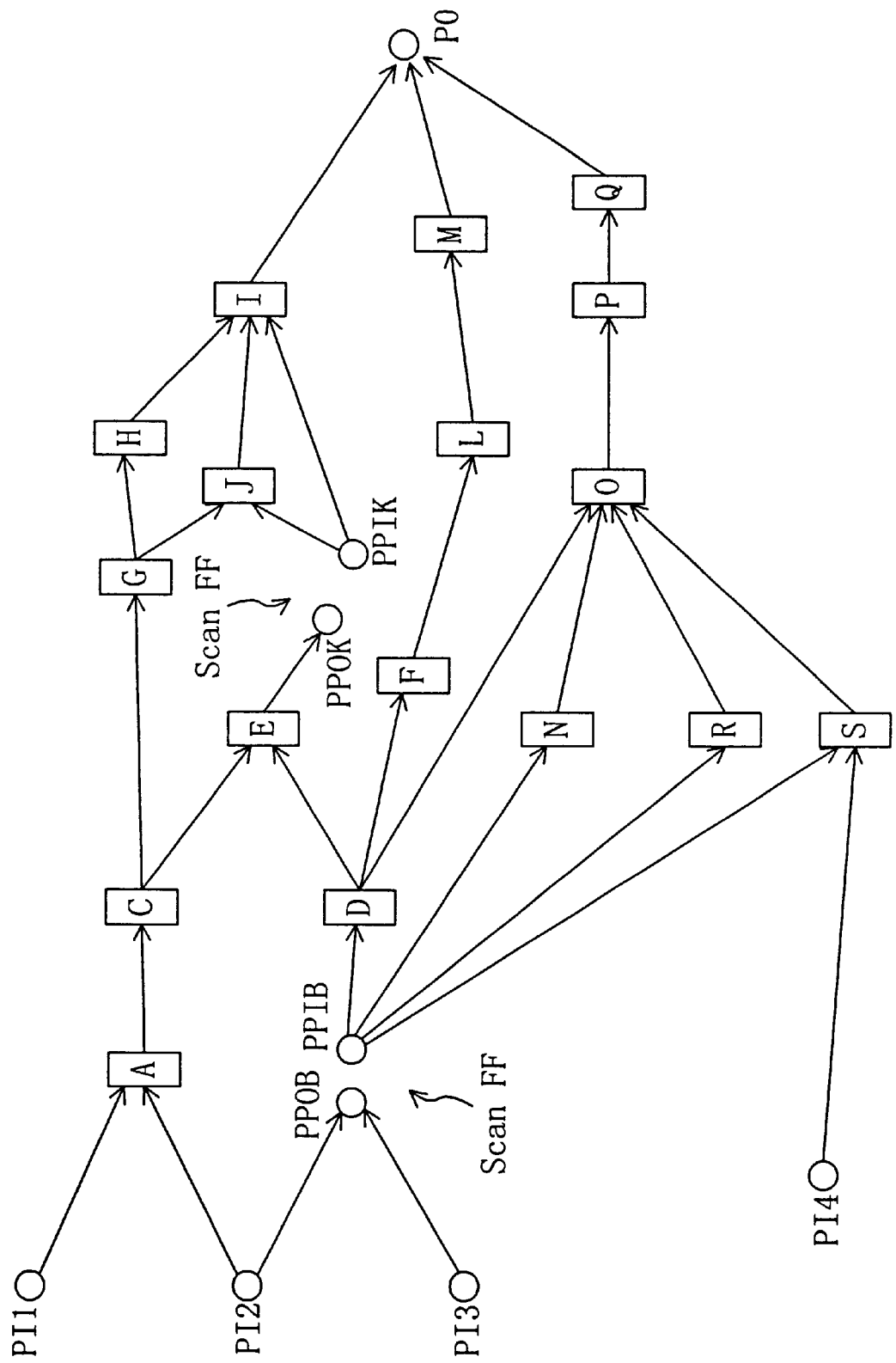
FIG. 48 is an FF relation graph obtained after replacing an FF K with a scan FF in the circuit of FIG. 45.

FIG. 48 is an FF relation graph obtained after selecting the FF K to replace with a scan FF. In FIG. 48, the FF K identified as a scan FF is deleted from the FF relation graph with the input of the FF K replaced with a pseudo primary output PPOK and the output thereof replaced with a pseudo primary input PPIK. The procedure then returns to step SG2 again, and a balanced reconvergence structure is searched for in the circuit of FIG. 48. As a result of the search, three balanced reconvergence structures are recognized as is shown in FIG. 49, but none of these balanced reconvergence structures includes eight or more FFs. Therefore, the process is completed through step SG3.

The selection of an FF to replace with a scan FF carried out in step SG4 is not limited to that described above. For example, as an FF to replace with a scan FF, it is possible to select an FF that is included in a balanced reconvergence structure including a predetermined number or more FFs as well as belongs to the largest number of balanced reconvergence structures in the entire circuit. Also, functions such as the depth of a balanced reconvergence structure, the number of paths and the number of FFs can be added to the selection function as a weight. Furthermore, plural FFs can be selected to replace with scan FFs.

Each of the embodiments of the invention can be similarly applied to an integrated circuit designed at register transfer level. In this case, registers included in an integrated circuit designed at register transfer level are dealt with in the same manner as FFs in each embodiment.

Figure 50:
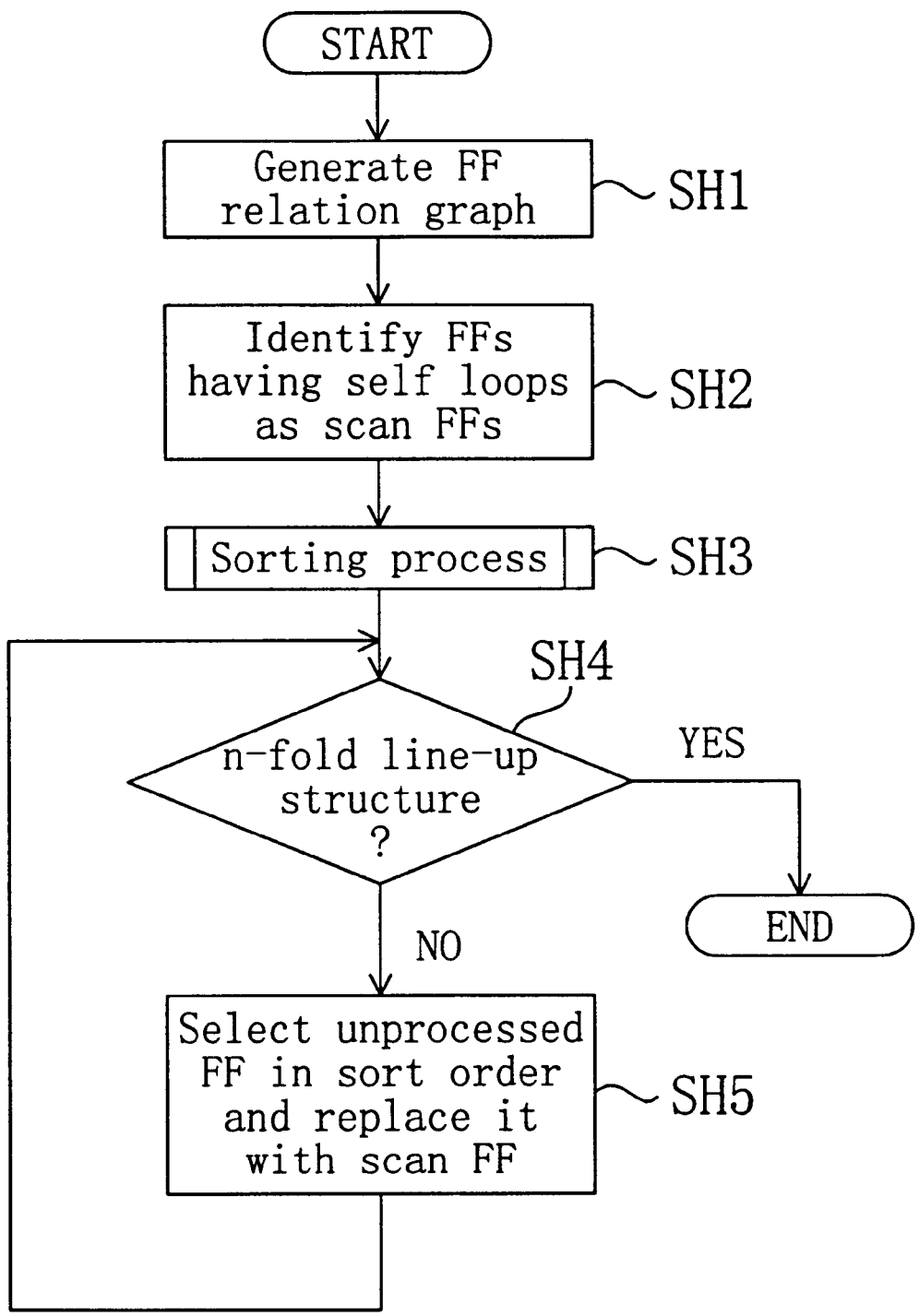
FIG. 50 is a flowchart of another exemplified method of design for testability using the sorting process according to Embodiments 1 through 3 of the invention.
Figure 51:
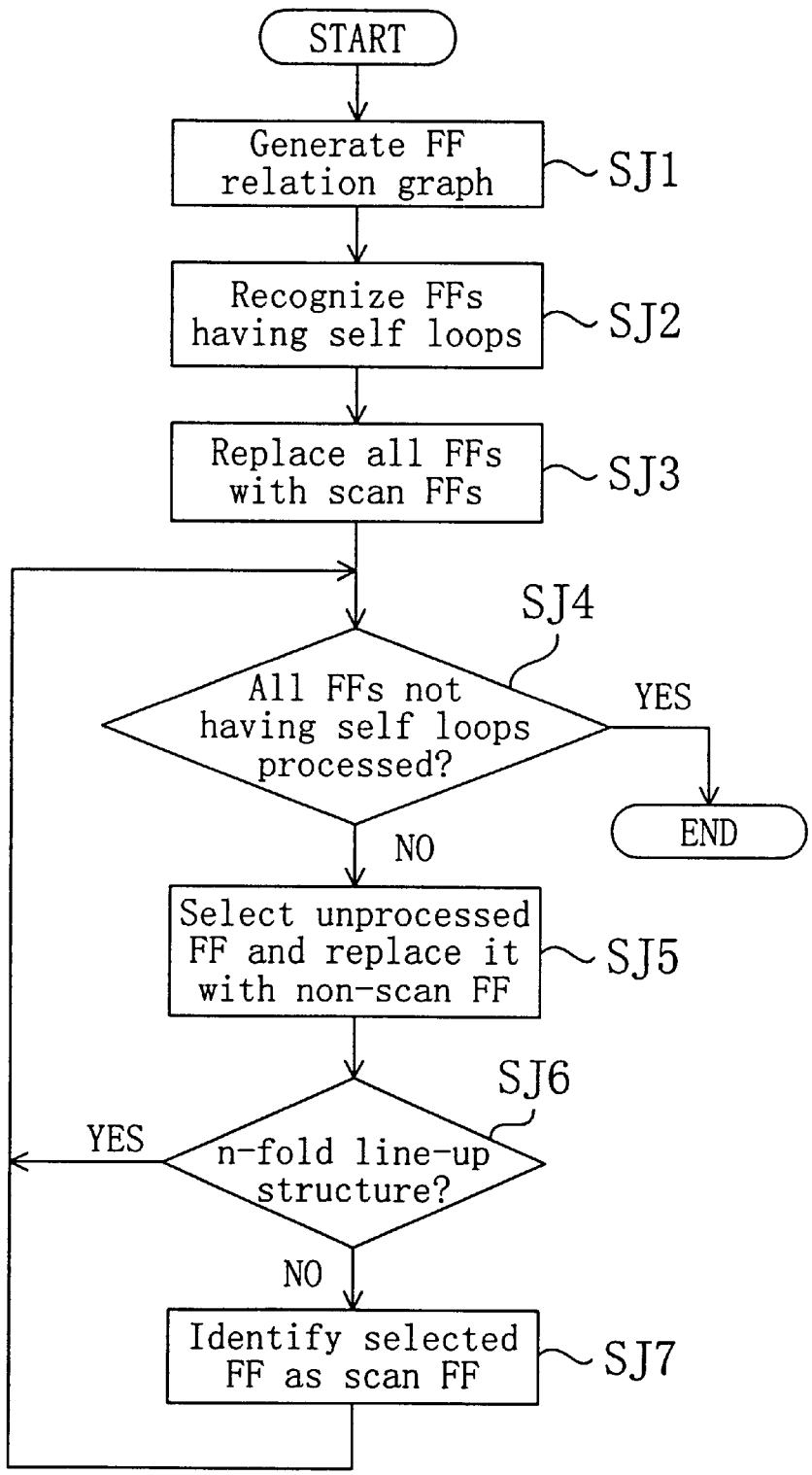
FIG. 51 is a flowchart of a conventional method of design for testability.

Furthermore, the sorting process in each of Embodiments 1 through 3 is applicable to scan FF identification in a non-scan circuit so that the circuit can have an n-fold line-up structure. FIG. 50 is a flowchart of a method of design for testability usable in this case. In FIG. 50, the same process as the sorting process of Embodiments 1 through 3 is carried out in step SH3 except that the sort order is reversed to that obtained in Embodiments 1 through 3. Thereafter, until the circuit has an n-fold line-up structure (SH4), FFs are successively replaced with scan FFs in the sort order obtained in step SH3 (SH5).

Moreover, each of Embodiments 5 through 7 can be singly adopted or appropriately combined. In addition, each of Embodiments 5 through 7 can be combined with the scan FF identification on the basis of an n-fold line-up structure. For example, when test sequences are generated for an integrated circuit obtained by the scan FF identification based on an n-fold line-up structure and the test sequence generation is unsatisfactory, the design for testability can be executed in the same manner as in any of Embodiments 5 through 7.

What is claimed is:

1. A method of design for testability for modifying design of an integrated circuit designed at gate level or register transfer level, in order to attain testability after manufacture, comprising:

a full scan process for temporarily determining about all flip-flops (FFs) or registers in said integrated circuit to replace with scan FFs or registers;

a sorting process for sorting said FFs or registers in accordance with a predetermined evaluation function indicating a degree of relation with difficulty in generating test sequences; and a non-scan selecting process for examining for each of said FFs or registers temporarily determined to replace with scan FFs or registers in said full scan process, in a sort order obtained in said sorting process, whether or not said integrated circuit has an n-fold line-up structure in assuming said FF or register to replace with a non-scan FF or register, and temporarily identifying said FF or register as a non-scan FF or register when said integrated circuit has an n-fold line-up structure by said assumption, wherein an FF or register temporarily identified as a scan FF or register as a result of executing said non-scan selecting process is defined as a scan FF or register.

2. The method of design for testability of claim 1, wherein said sort order is an ascending order of the degree of relation indicated by said predetermined evaluation function.

3. The method of design for testability of claim 1, wherein said sorting process comprises the steps of:

recognizing a balanced reconvergence structure included in said integrated circuit; and sorting said FFs or registers with using a function indicating a degree of relation with said recognized balanced reconvergence structure as said predetermined evaluation function.

4. The method of design for testability of claim 1, wherein said sorting process comprises the step of:

sorting said FFs or registers with using a number of inputs/outputs of each FF or register in an FF relation graph or a register relation graph representing said integrated circuit as said predetermined evaluation function.

5. The method of design for testability of claim 1, wherein said sorting process comprises the step of:

sorting said FFs or registers with using a result of a predetermined calculation using a maximum sequential input distance and a maximum sequential output distance as said predetermined evaluation function.

6. The method of design for testability of claim 1, wherein said non-scan selecting process comprises the steps of:

omitting said examining step for an FF or register identified to have a self loop structure; and maintaining temporary determination of said FF or register as to replace with a scan FF or register.

7. The method of design for testability of claim 1, further comprising a process for searching a single-output FF or a single-output register in said integrated circuit, wherein said non-scan selecting process comprises the steps of:
omitting said examining step for said searched single-output FF or single-output register; and
maintaining temporary determination of said searched single-output FF or single-output register as to replace with a scan FF or register.

8. The method of design for testability of claim 1, further comprising a process for searching a single-input/output FF or a single-input/output register in said integrated circuit, wherein said non-scan selecting process comprises the steps of:
omitting said examining step for said searched single-input/output FF or single-input/output register; and
maintaining temporary determination of said searched single-input/output FF or single-input/output register as to replace with a scan FF or register.

9. A method of design for testability for modifying design of an integrated circuit designed at gate level or register transfer level, in order to attain testability after manufacture, comprising:

a step of identifying a scan flip-flop (FF) or register in said integrated circuit so that said integrated circuit has an n-fold line-up structure, wherein said identification step comprises the steps of:
sorting FFs or registers in said integrated circuit in accordance with a predetermined evaluation function indicating a degree of relation with difficulty in generating test sequences; and determining for each of said FFs or registers in said integrated circuit whether or not to replace with a scan FF or register in a sort order obtained in said sorting process.

10. The method of design for testability of claim 9, wherein said sorting process comprises the steps of:

recognizing a balanced reconvergence structure included in said integrated circuit; and sorting said FFs or registers with using a function indicating a degree of relation with said recognized balanced reconvergence structure as said predetermined evaluation function.

11. The method of design for testability of claim 9, wherein said sorting process comprises the step of:

sorting said FFs or registers with using a number of inputs/outputs of each FF or register in an FF relation graph or a register relation graph representing said integrated circuit as said predetermined evaluation function.

12. The method of design for testability of claim 9, wherein said sorting process comprises the step of:

sorting said FFs or registers with using a result of a predetermined calculation using a maximum sequential input distance and a maximum sequential output distance as said predetermined evaluation function.

13. A method of design for testability for modifying design of an integrated circuit designed at gate level or register transfer level, in order to attain for testability after manufacture, comprising:

a step of identifying a scan flip-flop (FF) or register in said integrated circuit so that said integrated circuit has an n-fold line-up structure, wherein said identification step comprises the steps of:
searching a single-output FF or a single-output register in said integrated circuit; and
identifying said searched single-output FF or single-output register as a non-scan FF or register.

14. A method of design for testability for modifying design of an integrated circuit designed at gate level or register transfer level, in order to attain testability after manufacture, comprising:

a step of identifying a scan flip-flop (FF) or register in said integrated circuit so that said integrated circuit has an n-fold line-up structure, wherein said identification step comprises the steps of:
searching a single-input/output FF or a single-input/output register in said integrated circuit; and
identifying said searched single-input/output FF or single-input/output register as a non-scan FF or register.

* * * * *

UNITED STATES PATENT AND TRADEMARK OFFICE
CERTIFICATE OF CORRECTION

PATENT NO. : 6,510,535 B1
DATED : January 21, 2003
INVENTOR(S) : Hosokawa et al.

It is certified that error appears in the above-identified patent and that said Letters Patent is hereby corrected as shown below:

<u>Title page,</u>
Item [73], Assignee, "Matsushita Electric Industrial Co., Inc., Kadoma (JP)" should be -- Matsushita Electric Industrial Co., Ltd., Osaka (JP) --
Item [56], References Cited, U.S. PATENT DOCUMENTS,
"6,036,691 A" should be -- 6,038,691 A --

Signed and Sealed this

Thirteenth Day of January, 2004

JON W. DUDAS
*Acting Director of the United States Patent and Trademark Office*